United States Patent
Skee

(10) Patent No.: US 6,465,403 B1
(45) Date of Patent: Oct. 15, 2002

(54) SILICATE-CONTAINING ALKALINE COMPOSITIONS FOR CLEANING MICROELECTRONIC SUBSTRATES

(76) Inventor: David C. Skee, 3192 Rambeau Rd., Bethlehem, PA (US) 18020

( * ) Notice: Subject to any disclaimer, the term of this patent is extended or adjusted under 35 U.S.C. 154(b) by 0 days.

(21) Appl. No.: 09/701,114

(22) PCT Filed: May 17, 1999

(86) PCT No.: PCT/US99/10875

§ 371 (c)(1),
(2), (4) Date: Nov. 17, 2000

(87) PCT Pub. No.: WO99/60448

PCT Pub. Date: Nov. 25, 1999

Related U.S. Application Data

(60) Provisional application No. 60/115,084, filed on Jan. 7, 1999, and provisional application No. 60/085,861, filed on May 18, 1998.

(51) Int. Cl.[7] .................................................. B08B 7/00
(52) U.S. Cl. ...................... 510/175; 510/176; 510/178; 134/3; 438/745
(58) Field of Search ................................. 510/175, 176, 510/177, 178; 438/745; 430/331, 326, 286.1; 134/2, 13, 38, 42, 3, 40

(56) References Cited

U.S. PATENT DOCUMENTS 5,561,105 A * 10/1996 Honda
5,759,973 A * 6/1998 Honda et al.
5,817,610 A * 10/1998 Honda et al.

* cited by examiner

Primary Examiner—Gregory E. Webb

(57) ABSTRACT

The invention provides aqueous alkaline compositions useful in the microelectronics industry for stripping or cleaning semiconductor wafer substrates by removing photoresist residues and other unwanted contaminants. The compositions typically contain (a) one or more metal ion-free bases at sufficient amounts to produce a pH of about 10–13 and one or more bath stabilizing agents having at least one pKa in the range of 10–13 to maintain this pH during use; (b) optionally, about 0.01% to about 5% by weight (expressed as % $SiO_2$) of a water-soluble metal ion-free silicate; (c) optionally, about 0.01% to about 10% by weight of one or more chelating agents; (d) optionally, about 0.01% to about 80% by weight of one or more water-soluble organic co-solvents; and (e) optionally, about 0.01% to about 1% by weight of a water-soluble surfactant.

48 Claims, No Drawings

SILICATE-CONTAINING ALKALINE COMPOSITIONS FOR CLEANING MICROELECTRONIC SUBSTRATES

This application claims the benefit of provisional application No. 60/085,861 filed May 18, 1998 and No. 60/115,084, filed Jan. 7, 1999.

BACKGROUND OF THE INVENTION

1. Field of the Invention

This invention relates to compositions useful in the microelectronics industry for cleaning semiconductor wafer substrates. Particularly, this invention relates to alkaline stripping or cleaning compositions containing metal ion-free silicates that are used for cleaning wafers having metal lines and vias by removing metallic and organic contamination without damaging the integrated circuits.

2. Description of the Prior Art

An integral part of microelectronic fabrication is the use of photoresists to transfer an image from a mask or reticle to the desired circuit layer. After the desired image transfer has been achieved, an etching process is used to form the desired structures. The most common structures formed in this way are metal lines and vias.

The metal lines are used to form electrical connections between various parts of the integrated circuit that lie in the same fabrication layer. The vias are holes that are etched through dielectric layers and later filled with a conductive metal. These are used to make electrical connections between different vertical layers of the integrated circuit. A halogen containing gas is generally used in the processes used for forming metal lines and vias.

After the etching process has been completed, the bulk of the photoresist may be removed by either a chemical stripper solution or by an oxygen plasma ashing process. The problem is that these etching processes produce highly insoluble metal-containing residues that may not be removed by common chemical stripper solutions. Also, during an ashing process the metal-containing residues are oxidized and made even more difficult to remove, particularly in the case of aluminum-based integrated circuits. See, "Managing Etch and Implant Residue," *Semiconductor International,* August 1997, pages 56–63.

An example of such an etching process is the patterning of metal lines on an integrated circuit. In this process, a photoresist coating is applied over a metal film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual metal etching step is then performed. This etching step removes metal not covered by photoresist through the action of a gaseous plasma. Removal of such metal transfers the pattern from the photoresist layer to the metal layer. The remaining photoresist is then removed ("stripped") with an organic stripper solution or with an oxygen plasma ashing procedure. The ashing procedure is often followed by a rinsing step that uses a liquid organic stripper solution. However, the stripper solutions currently available, usually alkaline stripper solutions, leave insoluble metal oxides and other metal-containing residues on the integrated circuit.

Another example of such an etching process is the patterning of vias (interconnect holes) on an integrated circuit. In this process, a photoresist coating is applied over a dielectric film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual dielectric etching step is then performed. This etching step removes dielectric not covered by photoresist through the action of a gaseous plasma. Removal of such dielectric transfers the pattern from the photoresist layer to the dielectric layer. The remaining photoresist is then removed ("stripped") with an organic stripper solution or with an oxygen plasma ashing procedure. Typically, the dielectric is etched to a point where the underlying metal layer is exposed. A titanium or titanium nitride anti-reflective or diffusion barrier layer is typically present at the metal/dielectric boundary. This boundary layer is usually etched through to expose the underlying metal. It has been found that the action of etching through the titanium or titanium nitride layer causes titanium to be incorporated into the etching residues formed inside of the via. Oxygen plasma ashing oxidizes these via residues making them more difficult to remove. A titanium residue removal enhancing agent must therefore be added to the stripper solution to enable the cleaning of these residues. See "Removal of Titanium Oxide Grown on Titanium Nitride and Reduction of Via Contact Resistance Using a Modern Plasma Asher", *Mat. Res. Soc. Symp. Proc.,* Vol. 495, 1998, pages 345–352. The ashing procedure is often followed by a rinsing step that uses a liquid organic stripper solution. However, the stripper solutions currently available, usually alkaline stripper solutions, leave insoluble metal oxides and other metal-containing residues on the integrated circuit. There are some hydroxylamine-based strippers and post-ash residue removers on the market that have a high organic solvent content, but they are not as effective on other residues found in vias or on metal-lines. They also require a high temperature (typically 65° C. or higher) in order to clean the residues from the vias and metal-lines.

The use of alkaline strippers on microcircuit containing metal films has not always produced quality circuits, particularly when used with metal films containing aluminum or various combinations or alloys of active metals such as aluminum or titanium with more electropositive metals such as copper or tungsten. Various types of metal corrosion, such as corrosion whiskers, pitting, notching of metal lines, have been observed due, at least in part, to reaction of the metals with alkaline strippers. Further it has been shown, by Lee et al., Proc. Interface '89, pp. 137–149, that very little corrosive action takes place until the water rinsing step that is required to remove the organic stripper from the wafer. The corrosion is evidently a result of contacting the metals with the strongly alkaline aqueous solution that is present during rinsing. Aluminum metal is known to corrode rapidly under such conditions, Ambat et al., Corrosion Science, Vol. 33 (5), p. 684. 1992.

Prior methods used to avoid this corrosion problem employed intermediate rinses with non-alkaline organic solvents such as isopropyl alcohol. However, such methods are expensive and have unwanted safety, chemical hygiene, and environmental consequences.

The prior art discloses several organic strippers used to remove bulk photoresist after the etching process. U.S. Pat. Nos. 4,765,844, 5,102,777 and 5,308,745 disclose photoresist strippers comprising various combinations of organic solvents. These strippers, however, are not very effective on wafers that have been "ashed" with oxygen plasmas as described above. Some photoresist strippers attempt to address this problem by adding additional water and an organic corrosion inhibitor such as catechol. Such compositions are disclosed in U.S. Pat. Nos. 5,482,566, 5,279,771, 5,381,807, 5,334,332, 5,709,756, 5,707,947, and 5,419,779 and in WO 9800244. In some cases, the hydrazine derivative, hydroxylamine, is added as well. Because of its toxicity, the use of catechol gives rise to various environmental, safety, and health concerns.

Metal silicates have been included as corrosion inhibitors in cleaning solutions used on electronic circuit boards. Examples of such solutions are disclosed in SU 761976, DD 143,920, DD 143,921, U.S. Pat. Nos. 5,264,046, 5,234,505, 5,234,506, and 5,393,448. The metal lines on circuit boards are much larger than those found in integrated circuits thus have less demanding cleaning requirements. In the case of integrated circuits, metal contamination introduced from a cleaning solution, even at extremely low concentrations, can cause premature failure of the device. Therefore, any formulation containing intentionally added metals, such as the metal silicates cited above, would be detrimental to integrated circuit device performance and reliability. U.S. Pat. No. 4,659,650 discloses using a sodium metasilicate solution to dissolve metal lift-off masks.

In U.S. Pat. No. 5,817,610 and EP 829,768 the use of a quaternary ammonium silicate, quaternary ammonium hydroxide and water is disclosed for use in removing plasma etch residues. In these two disclosures, catechol oligimers are preferred over quaternary ammonium silicates as corrosion inhibitors and no examples of quaternary ammonium silicates being used as corrosion inhibitors are shown. In U.S. Pat. No. 5,759,973 and EP 828,197 the use of a quaternary ammonium silicate, an amine compound, water and optionally an organic polar solvent is disclosed for use as a stripping and cleaning composition. None of the four disclosures cited above discloses the advantages of adding an aminocarboxylic acid buffering agent or titanium residue removal enhancer. None of the four disclosures cited above discloses the advantages of adding a titanium residue removal enhancer. The present invention has shown that in some cases it is necessary to add a titanium residue removal enhancer for effective cleaning of some residues containing titanium found after a plasma etch process. U.S. Pat. No. 5,759,973 and EP 828,197 disclose the use of a chelating agent selected from sugars such as glucose, fructose or sucrose and sugar alcohols such as xylitol, mannitol and sorbitol. Lab tests of formulations of the present invention with fructose or sorbitol added resulted in a solution that was not as pH stable as formulations having an aminocarboxylic acid or no added chelating or buffering agent added.

Patent application WO 9523999 discloses using tetramethylammonium silicate and ammonium silicate as corrosion inhibitors in solutions used for removing resist from circuit boards. However, the lack of any (ethylenedinitrilo) tetraacetic acid (EDTA) content was described as an advantage of the disclosed formulation. In the present invention, in contrast, the optional use of chelating agents such as EDTA was beneficial.

Other uses of silicate inhibitors include magnetic head cleaners (JP 09,245,311), laundry detergents (WO 9,100, 330), metal processing solutions (DE 2,234,842. U.S. Pat. Nos. 3,639,185, 3,773,670, 4,351,883, 4,341,878, EP 743, 357, U.S. Pat. No. 4,710,232), rosin flux removers (U.S. Pat. No. 5,549,761), and photoresists (JP 50,101,103).

Both metal ion-free silicates such as tetramethylammonium silicate and metal silicates have been used as components of photoresist developers (U.S. Pat. No. 4,628,023, JP 63,147,163, U.S. Pat. Nos. 4,822,722, 4,931,380, RD 318, 056, RD 347,073, EP 62,733). Photoresist developers are used before the etching and oxygen plasma ashing processes to remove patterned photoresist areas which have been altered by exposure to light. This leaves a photoresist pattern on the wafer surface which is typically "hardened" by exposure to light and heat to form an etching mask. This mask is used during the plasma etching step and usually removed after this use by an oxygen plasma "ashing" step. The present invention relates to the removal of residues formed during these last two steps and is unrelated to the photoresist development step addressed by the patents cited in this paragraph.

Solutions prepared by dissolving silicic acid or solid silicon in tetramethylammonium hydroxide (TMAH) have been reported as useful for the passivation of aluminum structures during micromachining ("Aluminum passivation in Saturated TMAHW Solutions for IC-Compatible Microstructures and Device Isolation", Sarrow. et al., SPIE Vol. 2879, Proceedings-Micromachining and Microfabrication Process Technology II, The International Society for Optical Engineering, Oct. 14–15, 1996, pp. 242–250). Micromachining applications are outside of the scope of the present invention. The solutions in the cited reference contain about 25 weight percent silicate (expressed as $SiO_2$). This concentration is significantly greater than the concentrations used in the examples of this invention, which range from about 0.01 to about 2.9 weight percent silicate (expressed as $SiO_2$). The use of the chelating agent catechol as a silicon etch rate enhancer is also suggested. In the present invention, increasing the etch rate of silicon would be undesirable since this might damage the silicon dioxide dielectric layers commonly used in integrated circuits as well as the exposed silicon backside of the wafer.

The use of a quaternary ammonium hydroxide in photoresist strippers is disclosed in U.S. Pat. Nos. 4,776,892, 5,563,119; JP 09319098 A2; EP 578507 A2: WO 9117484 A1 and U.S. Pat. No. 4,744,834. The use of chelating and complexing agents to sequester metals in various cleaners has also been reported in WO 9705228, U.S. Pat. Nos. 5,466,389, 5,498,293, EP 812011, U.S. Pat. No. 5,561,105, JP 06216098, JP 0641773, JP 06250400 and GB 1,573,206.

U.S. Pat. No. 5,466,389 discloses an aqueous alkaline containing cleaning solution for microelectronics substrates that contains a quaternary ammonium hydroxide and optional metal chelating agents and is useful for a pH range of about 8 to 10. In the present invention, a pH greater than 10 is required to effect the desired residue removal. In addition, silicates have limited water solubility at about pH 10. Lab tests indicated that when the pH of a tetramethylammonium silicate solution is reduced to about 10 the solution becomes "cloudy" as silicates precipitate out of solution.

U.S. Pat. No 5,498,293 discloses a process for using an aqueous alkaline cleaning solution that contains a quaternary ammonium hydroxide and optional metal chelating agents useful for cleaning silicon wafers. The disclosure of this cleaning process is for treatments to substrates before the presence of integrated metal circuits and is used to generate a wafer surface that is essentially silicon dioxide free and would be employed before the use of photoresist for integrated circuit fabrication. The present invention, in contrast, focuses on the cleaning of wafers with integrated circuits present which have been photoresist coated, etched, and oxygen plasma ashed.

None of the compositions disclosed in the prior art effectively remove all organic contamination and metal-containing residues remaining after a typical etching process. There is, therefore, a need for stripping compositions that clean semiconductor wafer substrates by removing metallic and organic contamination from such substrates without damaging the integrated circuits. Such compositions must not corrode the metal features that partially comprise the integrated circuit and should avoid the expense and adverse consequences caused by intermediate rinses.

SUMMARY OF THE INVENTION

It is, therefore, an object of the present invention to provide compositions useful in the microelectronics industry for cleaning semiconductor wafer substrates.

It is another object of the present invention to provide compositions that remove metallic and organic contamination from semiconductor wafer substrates without damaging the integrated circuits.

It is another object of the present invention to provide compositions that avoid the expense and adverse consequences caused by intermediate rinses.

It is a further object of the present invention to provide a method for cleaning semiconductor wafer substrates that removes metallic and organic contamination from such substrates without damaging the integrated circuits and avoids the expense and adverse consequences caused by intermediate rinses.

These and other objects are achieved using new aqueous compositions for stripping or cleaning semiconductor wafer substrates that contain one or more metal ion-free bases and a water-soluble metal ion-free silicate. The compositions are placed in contact with a semiconductor wafer substrate for a time and at a temperature sufficient to clean unwanted contaminants and/or residues from the substrate surface.

Preferably, the compositions contain one or more metal ion-free bases dissolved in water in sufficient amounts to produce a pH of about 11 or greater and about 0.01% to about 2% by weight (calculated as $SiO_2$) of a water-soluble metal ion-free silicate. Any suitable base may be used in the compositions of this invention. Preferably, the base is selected from hydroxides and organic amines, most preferably quaternary ammonium hydroxides and ammonium hydroxides.

Any suitable silicate may be used in the compositions of this invention. Preferably, the silicate is selected from quaternary ammonium silicates, most preferably tetramethyl ammonium silicate.

The compositions of the present invention may contain other components such as chelating agents, organic co-solvents, titanium residue removal enhancing agents, and surfactants. Chelating agents are preferably present in amounts up to about 2% by weight, organic co-solvents are preferably present in amounts up to about 20% by weight, titanium residue removal enhancers are preferably present in amounts up to about 30% by weight, and surfactants are preferably present in amounts up to about 0.5% by weight.

The compositions can be used to clean substrates containing integrated circuits or can be used to clean substrates that do not contain integrated circuits. When integrated circuits are present, the composition removes the contaminants without damaging the integrated circuits.

The method for cleaning semiconductor wafer substrates of the present invention requires that the compositions of the present invention be placed in contact with a semiconductor wafer substrate for a time and at a temperature sufficient to clean unwanted contaminants and/or residues from the substrate surface. The method includes both bath and spray applications. Typically, the substrate is exposed to the composition for the appropriate time and at the appropriate temperature, rinsed using high purity de-ionized water, and dried.

The compositions clean wafer substrates by removing metallic and organic contamination. Importantly, the cleaning process does not damage integrated circuits on the wafer substrates and avoid the expense and adverse consequences associated by intermediate rinses required in prior methods.

Other objects, advantages, and novel features of the present invention will become apparent in the following detailed description of the invention.

DETAILED DESCRIPTION OF THE INVENTION

The present invention provides new aqueous compositions for stripping or cleaning semiconductor wafer substrates that contain one or more metal ion-free bases and a water-soluble metal ion-free silicate. Preferably, the invention provides aqueous, alkaline stripping or cleaning compositions comprising one or more alkaline metal ion-free base components in an amount sufficient to produce a solution pH of about 11 or greater, preferable from about pH 11 to about pH 13, and a metal ion-free water-soluble silicate concentration by weight (as $SiO_2$) of about 0.01% to about 5%, preferably from about 0.01% to about 2%.

The compositions may also contain a chelating agent in a concentration by weight of about 0.01% to about 10%, generally from about 0.01% to about 2%. Further optional components are water-soluble organic solvents in a concentration by weight of about 0.1% to about 80%, generally about 1% to about 30%, titanium residue removal enhancers in a concentration by weight of about 1% to about 50%, generally about 1% to about 30%, and a water-soluble surfactant in an amount by weight of about 0.01% to about 1%, preferable about 0.01% to about 0.5%.

The composition is an aqueous solution containing the base, the silicate, the optional components, if any, and water, preferably high purity de-ionized water.

Any suitable base may be used in the compositions of the present invention. The bases are preferably quaternary ammonium hydroxides, such as tetraalkyl ammonium hydroxides (including hydroxy- and alkoxy-containing alkyl groups generally of from 1 to 4 carbon atoms in the alkyl or alkoxy group). The most preferable of these alkaline materials are tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl) ammonium hydroxide, monomethyltri(2-hydroxyethyl) ammonium hydroxide, tetraethyl ammonium hydroxide, tetrapropyl ammonium hydroxide, tetrabutyl ammonium hydroxide, monomethyl-triethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, and the like and mixtures thereof.

Other bases that will function in the present invention include ammonium hydroxide, organic amines particularly alkanolamines such as 2-aminoethanol, 1-amino-2-propanol, 1-amino-3-propanol, 2-(2-aminoethoxy)ethanol, 2-(2-aminoethylamino)ethanol, 2-(2-aminoethylamino) ethylamine and the like, and other strong organic bases such as guanidine, 1,3-pentanediamine, 4-aminomethyl-1,8-octanediamine, aminoethylpiperazine, 4-(3-aminopropyl) morpholine, 1,2-diaminocyclohexane, tris(2-aminoethyl) amine, 2-methyl-1,5-pentanediamine and hydroxylamine. Alkaline solutions containing metal ions such as sodium or potassium may also be operative, but are not preferred because of the possible residual metal contamination that could occur. Mixtures of these additional alkaline components, particularly ammonium hydroxide, with the aforementioned tetraalkyl ammonium hydroxides are also useful.

Any suitable metal ion-free silicate may be used in the compositions of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits.

The compositions of the present invention may also be formulated with suitable metal chelating agents to increase the capacity of the formulation to retain metals in solution and to enhance the dissolution of metallic residues on the wafer substrate. Typical examples of chelating agents useful for this purpose are the following organic acids and their isomers and salts: (ethylenedinitrilo)tetraacetic acid (EDTA), butylenediaminetetraacetic acid, cyclohexane-1,2-diaminetetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine.

Preferred chelating agents are aminocarboxylic acids such as EDTA. Chelating agents of this class have a high affinity for the aluminum-containing residues typically found on metal lines and vias after plasma "ashing". In addition, the pKa's for this class of chelating agents typically include one pKa of approximately 12 which improves the performance of the compositions of the invention.

The compositions of the present invention may also contain one or more suitable water-soluble organic solvents. Among the various organic solvents suitable are alcohols, polyhydroxy alcohols, glycols, glycol ethers, alkyl-pyrrolidinones such as N-methylpyrrolidinone (NMP), 1-hydroxyalkyl-2-pyrrolidinones such as 1-(2-hydroxyethyl)-2-pyrrolidinone (HEP), dimethylformamide (DMF), dimethylacetamide (DMAc), sulfolane or dimethylsulfoxide (DMSO). These solvents may be added to reduce aluminum and/or aluminum-copper alloy and/or copper corrosion rates if further aluminum and/or aluminum-copper alloy and/or copper corrosion inhibition is desired. Preferred water-soluble organic solvents are polyhydroxy alcohols such as glycerol and/or 1-hydroxyalkyl-2-pyrrolidinones such as 1-(2-hydroxyethyl)-2-pyrrolidinone (HEP).

The compositions of the present invention may also contain one or more suitable titanium residue removal enhancers. Among the various titanium residue removal enhancers that are suitable are hydroxylamine, hydroxylamine salts, peroxides, ozone and fluoride. Preferred titanium residue removal enhancers are hydroxylamine and hydrogen peroxide.

The compositions of the present invention may also contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired.

Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof.

Preferably, the amphoteric surfactants are cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics.

Non-ionic surfactants useful in the compositions of the present invention include acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers. Preferably, the non-ionic surfactants are acetylenic diols or ethoxylated acetylenic diols.

Anionic surfactants useful in the compositions of the present invention include carboxylates, N-acylsarcosinates, sulfonates, sulfates, and mono and diesters of orthophosphoric acid such as decyl phosphate. Preferably, the anionic surfactants are metal-free surfactants.

Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants.

In the preferred embodiment of the present invention, the composition is an aqueous solution containing about 0.1–2% by weight tetramethylammonium hydroxide (TMAH) and about 0.01–1% by weight (calculated as % $SiO_2$,) tetramethylammonium silicate (TMAS).

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), and about 0.01–1% by by weight (calculated as % $SiO_2$) tetramethylammonium silicate (TMAS).

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA),about 0.01–1% by weight (calculated as % $SiO_2$) tetramethylammonium silicate (TMAS), and about 0.5–20% by weight of polyhydroxy compounds, preferably glycerol.

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.01–1% by weight (calculated as % $SiO_2$) tetramethylammonium silicate (TMAS), about 0.5–20% by weight of polyhydroxy compounds, and about 0.01–0.3% by weight of a nonionic ethoxylated acetylenic diol surfactant.

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraactic acid (CyDTA),about 0.01–1% by weight (calculated as % $SiO_2$)tetramethylammonium silicate (TMAS), and about 0.5–20% by weight of an alkylpyrrolidinone such as 1-(2-hydroxyethyl)-2-pyrrolidinone (HEP), preferably 1-(2-hydroxyethyl)-2-pyrrolidinone (HEP).

In another embodiment of the present invention, the composition is an aqueous solution containing about 0.1–2% by weight tetramethylammonium hydroxide (TMAH), about 0.01–1% by weight trans-(1,2-cyclohexylenedinitrilo) tetraacetic acid (CyDTA), about 0.01–1% by weight (calculated as % $SiO_2$) tetramethylammonium silicate (TMAS), about 0.5–20% by weight of an alkylpyrrolidinone such as 1-(2-hydroxyethyl)-2-pyrrolidinone (HEP), and about 0.01–0.3% by weight of a nonionic ethoxylated acetylenic diol surfactant.

In a preferred embodiment of the present invention, the composition is an aqueous solution containing about 0.1–10% by weight tetramethylammonium hydroxide (TMAH), about 0.01–1% by weight (calculated as % $SiO_2$) tetramethylammonium silicate (TMAS) and about 1–10% by weight hydrogen peroxide.

In another preferred embodiment of the present invention, the composition is an aqueous solution containing about 0.1–9% by weight tetramethylammonium hydroxide (TMAH), about 0.01–4% by weight (calculated as % $SiO_2$) tetramethylammonium silicate (TMAS) and about 1–20% by weight hydroxylamine.

In another embodiment of the present invention, the composition is an aqueous solution containing about 0.1–10% by weight tetramethylammonium hydroxide (TMAH), about 0.01–1% by weight trans-(1,2-cyclohexylenedinitrilo)tetraacetic acid (CyDTA),about 0.01–1% by weight (calculated as % $SiO_2$) tetramethylammonium silicate (TMAS) and about 1–10% by weight hydrogen peroxide.

In another embodiment of the present invention, the composition is an aqueous solution containing about 0.1–9% by weight tetramethylammonium hydroxide (TMAH), about 0.01–1% by weight trans-(1,2-cyclohexylenedinitrilo) tetraacetic acid (CyDTA), about 0.01–4% by weight (calculated as % $SiO_2$) tetramethylammonium silicate (TMAS) and about 1–20% by weight hydroxylamine.

In another embodiment of the present invention, the composition is an aqueous solution containing about 0.1–10% by weight tetramethylammonium hydroxide (TMAH), about 0.01–1% by weight trans-(1,2-cyclohexylenedinitrilo)tetraacetic acid (CyDTA), about 0.01–1% by weight (calculated as % $SiO_2$) tetramethylammonium silicate (TMAS), about 1–10% by weight hydrogen peroxide, and about 0.01–0.3% by weight of a nonionic ethoxylated acetylenic diol surfactant.

In another embodiment of the present invention, the composition is an aqueous solution containing about 0.1–9% by weight tetramethylammonium hydroxide (TMAH), about 0.01–1% by weight trans-(1,2-cyclohexylenedinitrilo) tetraacetic acid (CyDTA), about 0.01–4% by weight (calculated as % $SiO_2$) tetramethylammonium silicate (TMAS), about 1–20% by weight hydroxylamine, and about 0.01–0.3% by weight of a nonionic ethoxylated acetylenic diol surfactant.

In all the embodiments, the balance of the composition is made up with water, preferably high purity de-ionized water.

As shown in the examples below, compositions containing only the alkaline base are unable to produce effective cleaning action without corroding the aluminum metal integrated circuit features. The examples also show the utility of adding a soluble silicate to the highly basic formulations to (1) protect the aluminum metal integrated circuits from corrosion, (2) extend the solution bath life of these cleaner compositions by silicate buffering ($pKa_2$=11.8), and (3) decrease the silicon dioxide dielectric etch rate. Additional advantages of the compositions of the present invention are: (1) high water content that facilitates immediate rinsing with water without an intermediate (such as isopropanol) rinse to prevent post-cleaning metal corrosion and that results in negligible carbon contamination of the substrate surface, (2) reduced health, safety, environmental, and handling risks associated with the use of non-toxic components specifically avoiding catechol, volatile organic solvents, and organic amines characteristic of prior art compositions used to strip and clean integrated circuit substrates, (3) ability to remove titanium containing residues from integrated circuit substrates at low temperatures, (4) compatibility of these formulations with sensitive low k dielectric materials used in integrated circuits, (5) compatibility (low etch rates) with copper, and (6) ability of the compositions of this invention to clean and prevent contamination of a wafer substrate during a post chemical mechanical polishing (CMP) operation.

The method of the present invention cleans semiconductor wafer substrates by exposing the contaminated substrate to the compositions of the present invention for a time and at a temperature sufficient to clean unwanted contaminants from the substrate surface. Optionally, the substrate is rinsed to remove the composition and the contaminants and dried to remove any excess solvents or rinsing agents. The substrate can then be used for its intended purpose.

Preferably, the method uses a bath or spray application to expose the substrate to the composition. Bath or spray cleaning times are generally 1 minute to 30 minutes, preferably 5 minutes to 20 minutes. Bath or spray cleaning temperatures are generally 10° C. to 85° C., preferably 20° C. to 45° C.

If required, the rinse times are generally 10 seconds to 5 minutes at room temperature, preferably 30 seconds to 2 minutes at room temperature. Preferably de-ionized water is used to rinse the substrates.

If required, drying the substrate can be accomplished using any combination of air-evaporation, heat, spinning, or pressurized gas. The preferred drying technique is spinning under a filtered inert gas flow, such as nitrogen, for a period of time until the wafer substrate is dry.

The method of the present invention is very effective for cleaning semiconductor wafer substrates that have been previously oxygen plasma ashed to remove bulk photoresist, particularly wafer substrates containing a silicon, silicon oxide, silicon nitride, tungsten, tungsten alloy, titanium, titanium alloy, tantalum, tantalum alloy, copper, copper alloy, aluminum or aluminum alloy film. The method removes unwanted metallic and organic contaminants but does not cause unacceptable corrosion to the silicon, silicon oxide, silicon nitride, tungsten, tungsten alloy, titanium, titanium alloy, tantalum, tantalum alloy, copper, copper alloy, aluminum or aluminum alloy film.

The following examples illustrate the specific embodiment of the invention described in this document. As would be apparent to skilled artisans, various changes and modifications are possible and are contemplated within the scope of the invention described.

Experimental Procedures

The percentages given in the examples are by weight unless specified otherwise. The amount of aluminum metal corrosion is expressed as both percent metal loss and as a general corrosion remark. The general corrosion remarks given are very slight, slight, light, moderate and severe. A small amount of aluminum corrosion considered to be within acceptable limits were assigned very slight or slight. Light, moderate or severe corrosion were considered to be unacceptable. All cleaning and corrosion data entries generated using the Scanning Electron Microscope (SEM) or Field Emission Scanning Electron Microscope (FE-SEM) was based on a visual interpretation of differences between untreated and treated samples from the same wafer.

EXAMPLE 1

Aqueous solution "A" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.) and 0.14 weight percent (calculated as % $SiO_2$) tetramethylammonium silicate (TMAS) added (remainder of this solution being water) and has a pH of about 12.2. Aqueous solution "B" was prepared with 0.3 weight percent tetramethylammonium hydroxide (TMAH), 0.1 weight percent trans-(1,2-cyclohexylenedinitrilo)-tetraacetic acid (CyDTA), 0.07 weight percent of the non-ionic surfactant Surfynol-465 (remainder of this solution being water) and has a pH of about 12.7. Aqueous solution "C" was prepared with 0.08 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 and 0.13 weight percent (calculated as % $SiO_2$) tetramethylammonium silicate (TMAS) added (remainder of this solution being water) and has a pH of about 10.5. Aqueous solution "D" was prepared with 0.09 weight percent tetramethylammonium hydroxide (TMAH), 0.1 weight percent trans-(1,2-cyclohexylenedinitrilo)-tetraacetic acid (CyDTA), 0.07 weight percent of the non-ionic surfactant Surfynol-465 (remainder of this solution being water) and has a pH of about 9.6. Aqueous solution "E" was prepared with 0.1 weight percent tetramethylammonium hydroxide (TMAH), 0.1 weight percent trans-(1,2-cyclohexylenedinitrilo)-tetraacetic acid (CyDTA), 0.07 weight percent of the non-ionic surfactant Surfynol-465 and 0.010 weight percent (calculated as % $SiO_2$) tetramethylammonium silicate (TMAS) added (remainder of this solution being water) and has a pH of about 11.3 Aqueous solution "F" was prepared with 0.08 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (remainder of this solution being water) and has a pH of about 10.9. Wafer #1 samples with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind, were used to evaluate the performance of the solutions. A wafer sample was placed in each of these solutions at 21–65° C. for 5–10 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Table 1.

TABLE 1

| | SEM Evaluation Results | | | | | |
|---|---|---|---|---|---|---|
| Solution | Weight Percent Tetramethylammonium Silicate Added (calculated as % $SiO_2$) | pH | Time (min.) | Temp. (° C.) | Post-Ash Residue Removed (%) | Aluminum Metal Corrosion (% Metal Loss) |
| A | 0.14 | 12.2 | 5 | 35 | 100 | 0 |
| B | 0 | 12.7 | 5 | 35 | 100 | 80 (severe) |
| C | 0.13 | 10.5 | 5 | 35 | 0 | 0 |
| D | 0 | 9.6 | 5 | 35 | 100 | 20 (moderate) |

TABLE 1-continued

SEM Evaluation Results

| Solution | Weight Percent Tetramethyl-ammonium Silicate Added (calculated as % SiO$_2$) | pH | Time (min.) | Temp. (° C.) | Post-Ash Residue Removed (%) | Aluminum Metal Corrosion (% Metal Loss) |
|---|---|---|---|---|---|---|
| C | 0.13 | 10.5 | 5 | 65 | 2 | 0 |
| D | 0 | 9.6 | 5 | 65 | 100 | 80 (severe) |
| E | 0.010 | 11.3 | 10 | 21 | 100 | 0 |
| F | 0 | 10.9 | 10 | 22 | 100 | 15 (light) |

Referring to Table 1, the data show the ability of TMAS to prevent the corrosion of the aluminum features that accompanies exposure to alkaline solutions and show that the addition of tetramethylammonium silicate to tetramethylammonium hydroxide based cleaning solutions completely inhibits undesirable corrosion of an integrated circuit.

EXAMPLE 2

Aqueous solution "G" was prepared with 2.0 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465 and 0.13 weight percent (calculated as % SiO$_2$) tetramethylammonium silicate (TMAS) added (remainder of this solution being water) and has a pH of about 13.6. Aqueous solution "H" was prepared with 0.09 weight percent tetramethylammonium hydroxide (TMAH), 0.1 weight percent trans-(1,2-cyclohexylenedinitrilo) tetraacetic acid (CyDTA), 0.07 weight percent of the non-ionic surfactant Surfynol-465 and 0.14 weight percent (calculated as % SiO$_2$) tetramethylammonium silicate (TMAS) added (remainder of this solution being water) and has a pH of about 10.8. Aqueous solution "M" was prepared with 1.8 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465 and 1.3 weight percent (calculated as % SiO$_2$) tetramethylammonium silicate (TMAS) added (remainder of this solution being water) and has a pH of about 13.0. Aqueous solution "N" was prepared with 1.9 weight percent tetramethylammonium hydroxide (TMAH), 0.09 weight percent trans-(1, 2-cyclohexylenedinitrilo)tetraacetic acid (CyDTA), 0.06 weight percent of the non-ionic surfactant Surfynol-465 and 0.86 weight percent (calculated as % SiO$_2$) tetramethylammonium silicate (TMAS) added (remainder of this solution being water) and has a pH of about 13.2. Aqueous solution "O" was prepared with 1.9 weight percent tetramethylammonium hydroxide (TMAH), 0.09 weight percent trans-(1, 2-cyclohexylenedinitrilo)tetraacetic acid (CyDTA), 0.06 weight percent of the non-ionic surfactant Surfynol-465 and 0.70 weight percent (calculated as % SiO$_2$) tetramethylammonium silicate (TMAS) added (remainder of this solution being water) and has a pH of about 13.2. Aqueous solution "P" was prepared with 1.9 weight percent tetramethylammonium hydroxide (TMAH), 0.09 weight percent trans-(1, 2-cyclohexylenedinitrilo)tetraacetic acid (CyDTA), 0.06 weight percent of the non-ionic surfactant Surfynol-465 and 0.54 weight percent (calculated as % SiO$_2$) tetramethylammonium silicate (TMAS) added (remainder of this solution being water) and has a pH of about 13.3. Aqueous solution "Q" was prepared with 2.0 weight percent tetramethylammonium hydroxide (TMAH), 0.1 weight percent trans-(1,2-cyclohexylenedinitrilo)-tetraacetic acid (CyDTA), 0.06 weight percent of the non-ionic surfactant Surfynol-465 and 0.45 weight percent (calculated as % SiO$_2$) tetramethylammonium silicate (TMAS) added (remainder of this solution being water) and has a pH of about 13.3. Aqueous solution "R" was prepared with 2.0 weight percent tetramethylammonium hydroxide (TMAH), 0.1 weight percent trans-(1,2-cyclohexylenedinitrilo)tetraacetic acid (CyDTA), 0.06 weight percent of the non-ionic surfactant Surfynol-465 and 0.28 weight percent (calculated as % SiO$_2$) tetramethylammonium silicate (TMAS) added (remainder of this solution being water) and has a pH of about 13.4. Aqueous solution "S" was prepared with 2.0 weight percent tetramethylammonium hydroxide (TMAH), 0.1 weight percent trans-(1,2-cyclohexylenedinitrilo)tetraacetic acid (CyDTA), 0.07 weight percent trans-(1,2-surfactant Surfynol-465 and 0.19 weight percent (calculated as % SiO$_2$) tetramethylammonium silicate (TMAS) added (remainder of this solution being water) and has a pH of about 13.4. Aqueous solution "T" was prepared with 0.1 weight percent tetramethylammonium hydroxide (TMAH), 0.1 weight percent trans-(1,2-cyclohexylenedinitrilo)-tetraacetic acid (CyDTA), 0.07 weight percent of the non-ionic surfactant Surfynol-465 and 0.020 weight percent (calculated as % SiO$_2$) tetramethylammonium silicate (TMAS) added (remainder of this solution being water) and has a pH of about 11.2 Aqueous solution "U" was prepared with 0.1 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 and 0.070 weight percent (calculated as % SiO$_2$) tetramethylammonium silicate (TMAS) added (remainder of this solution being water) and has a pH of about 10.9. Wafer #1 samples with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind, were used to evaluate the performance of the solutions. A wafer sample was placed in the solution at 21–65° C. for 5–20 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Table 2.

TABLE 2

SEM Evaluation Results

| Solution | Weight Percent Tetramethylammonium Silicate Added (calculated as % SiO$_2$) | pH | Time (min.) | Temp. (° C.) | Post-Ash Residue Removed (%) | Aluminum Metal Corrosion (% Metal Loss) |
|---|---|---|---|---|---|---|
| H | 0.14 | 10.8 | 20 | 65 | 0 | 0 |
| U | 0.070 | 10.9 | 5 | 35 | 20 | 0 |
| T | 0.020 | 11.2 | 10 | 22 | 95 | 0 |
| E | 0.010 | 11.3 | 10 | 21 | 100 | 0 |
| A | 0.14 | 12.2 | 5 | 35 | 100 | 0 |
| M | 1.3 | 13.0 | 5 | 22 | 100 | 0 |
| M | 1.3 | 13.0 | 5 | 35 | 100 | 10 (light) |
| N | 0.86 | 13.2 | 5 | 22 | 100 | 6 (light) |
| O | 0.70 | 13.2 | 5 | 22 | 100 | 8 (light) |
| P | 0.54 | 13.3 | 5 | 22 | 100 | 10 (light) |
| Q | 0.45 | 13.3 | 5 | 23 | 100 | 10 (light) |
| R | 0.28 | 13.4 | 5 | 23 | 100 | 20 (moderate) |
| S | 0.19 | 13.4 | 5 | 23 | 100 | 20 (moderate) |
| G | 0.13 | 13.6 | 5 | 35 | 100 | 90 (severe) |

Referring to Table 2. the data show the need to increase the TMAS concentration as the pH is increased in order to prevent or moderate the corrosion of the aluminum features that accompanies exposure to these alkaline solutions and show that the optimum pH range for the solutions of the present application is about 11 to 13.

EXAMPLE 3

Aqueous solution "T" was prepared with 0.3 weight percent tetramethylammonium hydroxide (TMAH). 0.1 weight percent trans-(1,2-cyclohexylenedinitrilo)tetraacetic acid (CyDTA), 0.06 weight percent of the non-ionic surfactant Surfynol-465, 0.13 weight percent (calculated as % SiO$_2$) tetramethylammonium silicate (TMAS) and 5 weight percent glycerol added with the remainder of this solution being water. Aqueous solution "J" was prepared with 0.3 weight percent tetramethylammonium hydroxide (TMAH), 0.09 weight percent trans-(1,2-cyclohexylenedinitrilo)tetraacetic acid (CyDTA), 0.06 weight percent of the non-ionic surfactant Surfynol-465, 0.13 weight percent (calculated as % SiO$_2$) tetramethylammonium silicate (TMAS) and 6 weight percent glycerol added with the remainder of this solution being water. Aqueous solution "K" was prepared with 0.3 weight percent tetramethylammonium hydroxide (TMAH), 0.09 weight percent trans-(1, 2-cyclohexylenedinitrilo)tetraacetic acid (CyDTA), 0.06 weight percent of the non-ionic surfactant Surfynol-465. 0.12 weight percent (calculated as % SiO$_2$) tetramethylammonium silicate (TMAS) and 10 weight percent diethylene glycol (DEG) added with the remainder of this solution being water. Wafer #1 samples with one micron wide features and aluminum-copper raised lines capped with titanium-nitride that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind were used to evaluate the performance of the solutions. A wafer sample was placed in the solution at 21–35° C. for 5–20 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Table 3.

TABLE 3

SEM Evaluation Results

| Solution | Time (min.) | Temp. (° C.) | Solvent | Solvent Content (Weight %) | Post-Ash Residue Removed (%) | Aluminum Metal Corrosion |
|---|---|---|---|---|---|---|
| A | 5 | 35 | — | 0 | 100 | none |
| A | 20 | 21 | — | 0 | 100 | slight |
| I | 15 | 35 | Glycerol | 5 | 100 | none |
| I | 20 | 35 | Glycerol | 5 | 100 | none |
| J | 15 | 35 | Glycerol | 6 | 100 | none |
| K | 15 | 35 | DEG | 10 | 100 | none |
| K | 20 | 35 | DEG | 10 | 100 | none |

Referring to Table 3, the data show the advantages of the addition of a water-soluble organic solvent on the ability to prevent or moderate the corrosion of the aluminum features that accompanies exposure to alkaline solutions containing TMAS and illustrate that the addition of a water-soluble solvent to the compositions of the present invention allows longer cleaning times without corrosion of metal lines present in integrated circuits.

EXAMPLE 4

Aqueous solution "L" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465, 0.14 weight percent (calculated as % $SiO_2$) tetramethylammonium silicate (TMAS) and 3 weight percent glycerol added with the remainder of this solution being water. Wafer sample #2 with one-half micron wide by one micron deep holes (vias) through a dielectric material exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic residues behind. Wafer sample #3 with one micron wide by one micron deep tapered holes (vias) through a dielectric material exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic residues behind. These samples were used to evaluate the performance of the solutions. A wafer sample was placed in the solution at 20–21° C. for 10 minutes, removed, rinsed with de-ionized water and dried with pressurized nitrogen gas. After drying, the sample cross-sectioned and then inspected on a Scanning Electron Microscope (SEM) to determine the extent of cleaning and/or corrosion of the features. The results are shown in Table 4.

TABLE 4

SEM Evaluation Results

| Solution | Sample # | Time (min.) | Temp. (° C.) | Glycerol Content (Weight %) | Post-Ash Residue Removed (%) | Via-base Aluminum Metal Corrosion |
|---|---|---|---|---|---|---|
| A | 2 | 10 | 20 | 0 | 100 | slight |
| L | 2 | 10 | 21 | 3 | 100 | none |
| A | 3 | 10 | 21 | 0 | 100 | slight |
| L | 3 | 10 | 21 | 3 | 100 | none |

Referring to Table 4, the data show the advantages of the addition of a water-soluble organic solvent on the ability to prevent or moderate the corrosion of the aluminum features that accompanies exposure to alkaline solutions containing TMAS and illustrate that the addition of a water-soluble solvent to the compositions of the present invention allows the cleaning of vias without corrosion of metal at the base of the via.

EXAMPLE 5

Wafer #1 and #4 samples each with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind, were used to evaluate the performance of the solutions. A wafer sample was placed in the solution at 11–65° C. for 5–30 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Tables 5A, 5B, and 5C.

TABLE 5A

SEM Evaluation Results

| Solution | Sample # | Time (min.) | Temp. (° C.) | Post-Ash Residue Removed (%) | Aluminum Metal Corrosion (% Metal Loss) |
|---|---|---|---|---|---|
| A | 1 | 10 | 20 | 100 | 0 |
| A | 1 | 10 | 22 | 100 | 0 |
| A | 1 | 5 | 35 | 100 | 0 |
| A | 1 | 5 | 45 | 100 | 0 |

TABLE 5B

SEM Evaluation Results

| Solution | Sample # | Time (min.) | Temp. (° C.) | Post-Ash Residue Removed (%) | Aluminum Metal Corrosion (% Metal Loss) |
|---|---|---|---|---|---|
| L | 1 | 10 | 35 | 100 | 2 (very slight) |
| L | 1 | 5 | 45 | 100 | 1 (very slight) |
| L | 1 | 10 | 45 | 100 | 2 (very slight) |
| L | 1 | 15 | 45 | 100 | 2 (very slight) |
| L | 1 | 20 | 45 | 100 | 4 (slight) |
| L | 1 | 5 | 55 | 100 | 3 (slight) |
| L | 1 | 5 | 65 | 100 | 3 (slight) |

TABLE 5C

SEM Evaluation Results

| Solution | Sample # | Time (min.) | Temp. (° C.) | Post-Ash Residue Removed (%) | Aluminum Metal Corrosion (% Metal Loss) |
|---|---|---|---|---|---|
| A | 4 | 15 | 11 | 100 | 0 |
| A | 4 | 5 | 20 | 100 | 0 |
| A | 4 | 10 | 20 | 100 | 1 (very slight) |
| A | 4 | 10 | 20 | 100 | 3 (slight) |
| A | 4 | 15 | 20 | 100 | 10 (light) |
| A | 4 | 20 | 20 | 100 | 10 (light) |
| A | 4 | 25 | 20 | 100 | 10 (light) |
| A | 4 | 30 | 20 | 100 | 10 (light) |
| A | 4 | 5 | 35 | 100 | 1 (very slight) |
| A | 4 | 5 | 45 | 100 | 1 (very slight) |

Referring to Tables 5A, 5B and 5C, the data show that there is considerable process latitude for these formulations both with (solution "L") and without (solution "A") the addition of a water-soluble organic solvent. A comparison of Tables 5B and 5C also illustrates that the addition of a water-soluble organic solvent (solution "L") further improves the process latitude by decreasing the aluminum metal corrosion that occurs with longer process times and higher temperatures. In Table 5B, in which organic solvent was added to the formulation, the observed corrosion range was only 0–4%, even when a cleaning temperature of 65° C. was used. In Table 5C, in which no organic solvent was added, more than 4% corrosion was observed with cleaning times greater than 10 minutes. The data also illustrate the considerable process latitude obtained with the compositions of this invention and show that process latitude can be further improved by the addition of optional water-soluble solvents.

EXAMPLE 6

Aqueous solution "V" was prepared with 0.3 weight percent tetramethylammonium hydroxide (TMAH), 0.07 weight percent of the non-ionic surfactant Surfynol-465, and 0.14 weight percent (calculated as % $SiO_2$) tetramethylammonium silicate (TMAS) added with the remainder of this solution being water. Aqueous solution "W" was prepared with 0.6 weight percent tetramethylammonium hydroxide (TMAH), 0.3 weight percent trans-(1,2-cyclohexylenedinitrilo)tetraacetic acid (CyDTA), 0.07 weight percent of the non-ionic surfactant Surfynol-465, and 0.14 weight percent (calculated as % $SiO_2$) tetramethylammonium silicate (TMAS) added with the remainder of this solution being water. Aqueous solution "X" was prepared with 0.7 weight percent tetramethylammonium hydroxide (TMAH), 0.5 weight percent trans-(1,2-cyclohexylenedinitrilo)tetraacetic acid (CyDTA), 0.07 weight percent of the non-ionic surfactant Surfynol-465, and 0.14 weight percent (calculated as % $SiO_2$) tetramethylammonium silicate (TMAS) added with the remainder of this solution being water. Wafer #4 samples with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind, were used to evaluate the performance of the solutions. A wafer sample was placed in the solution at 20–21° C. for 5 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Table 6.

TABLE 6

SEM Evaluation Results

| Solution | Time (min.) | Temp. (° C.) | CyDTA Content (Weight %) | Post-Ash Residue Removed (%) | Via-base Aluminum Metal Corrosion |
|---|---|---|---|---|---|
| V | 5 | 21 | 0 | 100 | none |
| A | 5 | 20 | 0.1 | 100 | none |
| W | 5 | 20 | 0.3 | 100 | very slight |
| X | 5 | 21 | 0.5 | 100 | none |

Referring to Table6, the data show that good stripping performance can be obtained over a wide range of CyDTA concentrations. Thus, the amount of chelating agent present can be adjusted to accommodate the sample to be cleaned. More difficult samples may require this optional ingredient to accomplish complete cleaning. The data also illustrate the optional use of a chelating agent in the compositions disclosed herein.

EXAMPLE 7

Aqueous solution "Y" was prepared with 0.4 weight percent tetramethylammonium hydroxide (TMAH), 0.1 weight percent trans-(1,2-cyclohexylenedinitrilo)tetraacetic acid (CyDTA), and 0.14 weight percent (calculated as % $SiO_2$) tetramethylammonium silicate (TMAS) added with the remainder of this solution being water. Wafer #4 samples with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind, were used to evaluate the performance of the solutions. A wafer sample was placed in the solution at 20–21° C. for 5 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Table 7.

TABLE 7

SEM Evaluation Results

| Solution | Time (min.) | Temp. (° C.) | Surfactant Surfynol-465 Content (Weight %) | Post-Ash Residue Removed (%) | Via-base Aluminum Metal Corrosion |
|---|---|---|---|---|---|
| A | 5 | 20 | 0.07 | 100 | none |
| Y | 5 | 21 | 0 | 100 | none |

Referring to Table 7, the data show that good stripping performance can be obtained for formulations that incorporate a surfactant to improve the wetting of the substrate and illustrate the optional use of a surfactant in the compositions disclosed herein.

EXAMPLE 8

Standard baths were used to perform open bath aging experiments on two different formulations. The first bath was run at room temperature for 24.75 hours and the second bath was run for 24.75 hours at 45° C. Wafer #4 samples with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind, were used to evaluate the performance of the solutions. A wafer sample was placed in the bath at 20° C. or 45° C. for 10 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Table 8.

TABLE 8

SEM Evaluation Results

| Solution | Open Bath Age (Hours) | Solution pH | Time (min.) | Temp. (° C.) | Post-Ash Residue Removed (%) | Aluminum Metal Corrosion |
|---|---|---|---|---|---|---|
| A | 0 | 12.2 | 10 | 20 | 100 | none |
| A | 24.75 | 12.0 | 10 | 20 | 100 | none |
| L | 0 | 12.0 | 10 | 45 | 100 | none |
| L | 24.75 | 11.9 | 10 | 45 | 100 | none |

Referring to Table 8, the data show the benefits of silicate buffering during extended time open-bath aging at both room temperature and at an elevated temperature. No change in stripping performance occurred during this aging period. The data also illustrate the insensitivity to aging of the compositions of this invention.

EXAMPLE 9

Aqueous solution "A1" was prepared with 0.27 weight percent tetramethylammonium hydroxide (TMAH) and 0.14 weight percent (calculated as % $SiO_2$) tetramethylammonium silicate (TMAS) added with the remainder of this solution being water (solution pH=12.3). Aqueous solution "A2" was prepared with 0.38 weight percent tetramethylammonium hydroxide (TMAH), 0.09 weight percent of the chelating agent (ethylenedinitrilo)tetraacetic acid (EDTA) and 0.14 weight percent (calculated as % $SiO_2$) tetramethylammonium silicate (TMAS) added with the remainder of this solution being water (solution pH=12.3). Aqueous solution "A3" was prepared with 0.39 weight percent tetramethylammonium hydroxide (TMAH), 0.10 weight percent of the chelating agent diethylenetriaminepentaacetic acid (DETPA) and 0.14 weight percent (calculated as % $SiO_2$) tetramethylammonium silicate (TMAS) added with the remainder of this solution being water (solution pH=12.3). Aqueous solution "A4" was prepared with 0.40 weight percent tetramethylammonium hydroxide (TMAH), 0.10 weight percent of the chelating agent triethylenetetraminehexaacetic acid (TTHA) and 0.14 weight percent (calculated as % $SiO_2$) tetramethylammonium silicate (TMAS) added with the remainder of this solution being water (solution pH=12.3). Aqueous solution "A5" was prepared with 0.40 weight percent tetramethylammonium hydroxide (TMAH), 0.10 weight percent of the chelating agent 1,3-diamino-2-hydroxypropane-N,N,N',N'-tetraacetic acid (DHPTA) and 0.14 weight percent (calculated as % $SiO_2$) tetramethylammonium silicate (TMAS) added with the remainder of this solution being water (solution pH=12.3). Aqueous solution "A6" was prepared with 0.47 weight percent tetramethylammonium hydroxide (TMAH), 0.13 weight percent of the chelating agent N,N,N',N'-ethylenediaminetetra(methylenephosphonic acid) (EDTMP) and 0.14 weight percent (calculated as % $SiO_2$) tetramethylammonium silicate (TMAS) added with the remainder of this solution being water (solution pH=12.3). Each solution was placed into a 125 ml glass bottle, loosely capped and placed into a oven set at 45° C. for one hour. A 0.05 mm×12 mm×50 mm, 99.8% pure aluminum foil coupon was washed with acetone, dried, then weighed on an analytical balance. After one hour of pre-heating each solution was removed from the oven and the aluminum foil coupon was then placed into the bottle, loosely re-capped and placed back into the oven. After one hour at about 45° C., the bottle was removed from the oven. The aluminum coupon was removed, rinsed with water, followed by an acetone rinse, dried and then weighed on an analytical balance. The relative corrosion rates were determined by weight loss. The results are shown in Table 9.

TABLE 9

Aluminum Foil Etch Rate Comparisons

| Solution | pH | Chelating Agent Tested | Amount of Chelating Agent Added (Weight %) | Relative Aluminum Corrosion Rate |
|---|---|---|---|---|
| A1 | 12.3 | — | 0 | 1 |
| A2 | 12.3 | EDTA | 0.090 | 3.5 |
| A3 | 12.3 | DETPA | 0.10 | 3.4 |
| A4 | 12.3 | TTHA | 0.10 | 3.3 |
| A5 | 12.3 | DHPTA | 0.10 | 3.4 |
| A6 | 12.3 | EDTMP | 0.13 | 4.0 |

Referring to Table 9, the data show the utility of adding a chelating agent to accelerate aluminum etching rates. Increased aluminum etching rates are sometimes needed to enable the removal of the metallic residues found on post oxygen plasma ashed wafers in an acceptable stripping temperature and time range. The data also illustrate the use of optional chelating agents with varied structures to obtain a desirable aluminum etching rate for the compositions invented herein.

EXAMPLE 10

Aqueous solution "B1" was prepared with 0.22 weight percent tetramethylammonium hydroxide (TMAH), 0.1 weight percent trans-(1,2-cyclohexylenedinitrilo)tetraacetic acid (CyDTA), and 0.14 weight percent (calculated as % $SiO_2$) tetramethylammonium silicate (TMAS) added with the remainder of this solution being water (solution pH=12.3). Aqueous solution "B2" was prepared with 0.30 weight percent tetramethylammonium hydroxide (TMAH), 0.10 weight percent trans-(1,2-cyclohexylenedinitrilo) tetraacetic acid (CyDTA), and 0.14 weight percent (calculated as % $SiO_2$) tetramethylammonium silicate (TMAS) added with the remainder of this solution being water (solution pH=12.3). Aqueous solution "B3" was prepared with 0.45 weight percent tetramethylammonium hydroxide (TMAH), 0.30 weight percent trans-(1,2-cyclohexylenedinitrilo)tetraacetic acid (CyDTA), and 0.14 weight percent (calculated as % $SiO_2$) tetramethylammonium silicate (TMAS) added with the remainder of this solution being water (solution pH=12.2). Aqueous solution "B4" was prepared with 0.59 weight percent tetramethylammonium hydroxide (TMAH), 0.50 weight percent trans-(1,2-cyclohexylenedinitrilo) tetraacetic acid (CyDTA), and 0.14 weight percent (calculated as % $SiO_2$) tetramethylammonium silicate (TMAS) added with the remainder of this solution being water (solution pH=12.1). Aqueous solution "B5" was prepared with 1.1 weight percent tetramethylammonium hydroxide (TMAH), 1.0 weight percent trans-(1,2-cyclohexylenedinitrilo)tetraacetic acid (CyDTA), and 0.14 weight percent (calculated as % $SiO_2$,) tetramethylammonium silicate (TMAS) added with the remainder of this solution being water (solution pH=12.3). Aqueous solution "B6" was prepared with 4.1 weight percent tetramethylammonium hydroxide (TMAH), 4.8 weight percent trans-(1,2-cyclohexylenedinitrilo) tetraacetic acid (CyDTA), and 0.13 weight percent (calculated as % $SiO_2$) tetramethylammonium silicate (TMAS) added with the remainder of this solution being water (solution pH=12.3). Each solution was placed into a 125 ml polyethylene bottle, loosely capped and placed into a oven set at 45° C. for one hour. A 0.05 mm×12 mm×50 mm, 99.8% pure aluminum foil coupon was washed with acetone, dried, then weighed on an analytical balance. After one hour of pre-heating each solution was removed from the oven and the aluminum foil coupon was then placed into the bottle, loosely re-capped and placed back into the oven. After one hour at about 45° C., the bottle was removed from the oven. The aluminum coupon was removed, rinsed with water, followed by an acetone rinse, dried and then weighed on an analytical balance. The relative corrosion rates were determined by weight loss. The results are shown in Table 10.

TABLE 10

Aluminum Foil Etch Rate Comparisons

| Solution | pH | Chelating Agent Tested | Amount of Chelating Agent Added (Weight %) | Relative Aluminum Corrosion Rate |
|---|---|---|---|---|
| B1 | 12.3 | — | 0 | 1 |
| B2 | 12.3 | CyDTA | 0.10 | 3.7 |
| B3 | 12.2 | CyDTA | 0.30 | 3.9 |
| B4 | 12.1 | CyDTA | 0.50 | 4.0 |
| B5 | 12.3 | CyDTA | 1.0 | 12 |
| B6 | 12.3 | CyDTA | 4.8 | 16 |

Referring to Table 10, the data show the utility of adding a chelating agent to accelerate aluminum etching rates. Increased aluminum etching rates are sometimes needed to enable the removal of the metallic residues found in post oxygen plasma ashed wafers in an acceptable stripping temperature and time range. The aluminum etching rate is proportional to the amount of chelating agent used. The data also illustrate the use of an optional chelating agent, added at various concentrations, to obtain a desirable aluminum etching rate for the compositions invented herein.

EXAMPLE 11

Aqueous solution "C1" was prepared with 0.25 weight percent tetramethylammonium hydroxide (TMAH) and 0.14 weight percent (calculated as % SiO$_2$) tetramethylammonium silicate (TMAS) added with the remainder of this solution being water (solution pH=12.3). Aqueous solution "C2" was prepared with 0.36 weight percent choline and 0.14 weight percent (calculated as % SiO$_2$) tetramethylammonium silicate (TMAS) added with the remainder of this solution being water (solution pH=12.3). Aqueous solution "C3" was prepared with 0.76 weight percent tetrabutylammonium hydroxide (TBAH) and 0.14 weight percent (calculated as % SiO$_2$) tetramethylammonium silicate (TMAS) added with the remainder of this solution being water (solution pH=12.3). Aqueous solution "C4" was prepared with 1.6 weight percent methyltriethanolammonium hydroxide (MAH) and 0.14 weight percent (calculated as % SiO$_2$) tetramethylammonium silicate (TMAS) added with the remainder of this solution being water (solution pH=12.3) Aqueous solution "C5" was prepared with 0.36 weight percent methyltriethylammonium hydroxide (MTEAH) and 0.14 weight percent (calculated as % SiO$_2$) tetramethylammonium silicate (TMAS) added with the remainder of this solution being water (solution pH=12.3). Each solution was placed into a 125 ml glass bottle, loosely capped and placed into a oven set at 45° C. for one hour. A 0.05 mm×12 mm×50 mm, 99.8% pure aluminum foil coupon was washed with acetone, dried, then weighed on an analytical balance. After one hour of pre-heating each solution was removed from the oven and the aluminum foil coupon was then placed into the bottle, loosely re-capped and placed back into the oven. After one hour at about 45° C. the bottle was removed from the oven. The aluminum coupon was removed, rinsed with water, followed by to an acetone rinse, dried and then weighed on an analytical balance. The relative corrosion rates were determined by weight loss. The results are shown in Table 11.

TABLE 11

Aluminum Foil Etch Rate Comparisons

| Solution | pH | Base Tested | Amount of Base Added (Weight %) | Relative Aluminum Corrosion Rate |
|---|---|---|---|---|
| C1 | 12.3 | TMAH | 0.25 | 1 |
| C2 | 12.3 | Choline | 0.36 | 3.7 |
| C3 | 12.3 | TBAH | 0.76 | 2.1 |
| C4 | 12.3 | MAH | 1.6 | 4.6 |
| C5 | 12.3 | MTEAH | 0.36 | 2.4 |

Referring to Table 11, the data show that that different metal ion-free bases may be substituted for TMAH to give enhanced aluminum etching rates. Increased aluminum etching rates are sometimes needed to enable the removal of the metallic residues found in post oxygen plasma ashed wafers in an acceptable stripping temperature and time range. The data also illustrate the use of metal ion-free alkaline components with varied structures to obtain a desirable aluminum etching rate for the compositions invented herein.

EXAMPLE 12

Aqueous solution "D1" was prepared with 0.14 weight percent tetramethylammonium hydroxide (TMAH) added with the remainder of this solution being water (solution pH=12.3). Aqueous solution "D2" was prepared with 0.25 weight percent tetramethylammonium hydroxide and 0.14 weight percent (calculated as % SiO$_2$) tetramethylammonium silicate (TMAS) added with the remainder of this solution being water (solution pH=12.3). Aqueous solution "D3" was prepared with 1.2 weight percent tetramethylammonium hydroxide (TMAH) and 1.3 weight percent (calculated as % SiO$_2$) tetramethylammonium silicate (TMAS) added with the remainder of this solution being water (solution pH=12.6). Aqueous solution "D4" was prepared with 1.8 weight percent tetramethylammonium hydroxide (TMAH) and 2.8 weight percent (calculated as % SiO$_2$) tetramethylammonium silicate (TMAS) added with the remainder of this solution being water (solution pH=12.6). Each solution was placed into a 125 ml glass bottle, loosely capped and placed into a oven set at 45° C. for one hour. A 0.05 mm×12 mm×50 mm, 99.8% pure aluminum foil coupon was washed with acetone, dried, then weighed on an analytical balance. After one hour of pre-heating each solution was removed from the oven and the aluminum foil coupon was then placed into the bottle, loosely re-capped and placed back into the oven. After one hour at about 45° C. the bottle was removed from the oven. The aluminum coupon was removed, rinsed with water, followed by an acetone rinse, dried and then weighed on an analytical balance. The relative corrosion rates were determined by weight loss. The results are shown in Table 12.

TABLE 12

Aluminum Foil Etch Rate Comparisons

| Solution | pH | Base Used | Amount of TMAS Added (Weight % as SiO$_2$) | Relative Aluminum Corrosion Rate |
|---|---|---|---|---|
| D1 | 12.3 | TMAH | 0 | 1 |
| D2 | 12.3 | TMAH | 0.14 | 0.25 |
| D3 | 12.6 | TMAH | 1.3 | 0.003 |
| D4 | 12.6 | TMAH | 2.8 | 0 |

Referring to Table 12, the data show that that the addition of a silicate to a metal ion-free basic solution inhibits the corrosion of aluminum metal and illustrate the use of a metal ion-free silicate, added at various concentrations, to obtain a desirable aluminum etching rate for the compositions invented herein.

EXAMPLE 13

Aqueous solution "E1" was prepared with 0.22 weight percent tetramethylammonium hydroxide (TMAH) and 0.14 weight percent (calculated as % SiO$_2$) tetramethylammonium silicate (TMAS) added with the remainder of this solution being water (solution pH=12.2). Aqueous solution "E2" was prepared with 0.22 weight percent tetramethylammonium hydroxide (TMAH), 0.14 weight percent (calculated as % SiO$_2$) tetramethylammonium silicate (TMAS) and 2.9 weight percent glycerol added with the remainder of this solution being water (solution pH=12.1). Aqueous solution "E3" was prepared with 0.20 weight percent tetramethylammonium hydroxide (TMAH), 0.13 weight percent (calculated as % SiO$_2$) tetramethylammonium silicate (TMAS) and 9.1 weight percent triethyleneglycol-monomethyl-ether added with the remainder of this solution being water (solution pH=12.2). Aqueous solution "E4" was prepared with 0.19 weight percent tetramethylammonium hydroxide (TMAH), 0.12 weight percent (calculated as % SiO$_2$) tetramethylammonium silicate (TMAS) and 13 weight percent N-methyl-pyrrolidinone added with the remainder of this solution being water (solution pH=12.2). Aqueous solution "E5" was prepared with 0.19 weight percent tetramethylammonium hydroxide (TMAH), 0.12 weight percent (calculated as % SiO$_2$) tetramethylammonium silicate (TMAS) and 17 weight percent diethylene glycol added with the remainder of this solution being water (solution pH=12.1). Aqueous solution "E6" was prepared with 0.17 weight percent tetramethylammonium hydroxide (TMAH), 0.11 weight percent (calculated as % SiO$_2$) tetramethylammonium silicate (TMAS) and 23 weight percent isopropyl alcohol added with the remainder of this solution being water (solution pH=12.7). Each solution was placed into a 125 ml polyethylene bottle, loosely capped and placed into a oven set at 45° C. for one hour. A 0.05 mm×12 mm×50 mm, 99.8% pure aluminum foil coupon was washed with acetone, dried, then weighed on an analytical balance. After one hour of pre-heating each solution was removed from the oven and the aluminum foil coupon was then placed into the bottle, loosely re-capped and placed back into the oven. After one hour at about 45° C. the bottle was removed from the oven. The aluminum coupon was removed, rinsed with water, followed by an acetone rinse, dried and then weighed on an analytical balance. The relative corrosion rates were determined by weight loss. The results are shown in Table 13.

TABLE 13

Aluminum Foil Etch Rate Comparisons

| Solution | pH | Organic Solvent Tested | Amount of Organic Solvent Added (Weight %) | Relative Aluminum Corrosion Rate |
|---|---|---|---|---|
| E1 | 12.2 | — | 0 | 1 |
| E2 | 12.1 | Glycerol | 2.9 | 0.90 |
| E3 | 12.2 | Triethyleneglycol monomethyl ether | 9.1 | 0.34 |
| E4 | 12.2 | N-Methyl-pyrrolidinone | 13 | 0.21 |
| E5 | 12.1 | Diethylene glycol | 17 | 0.21 |
| E6 | 12.7 | Isopropanol | 23 | 0.14 |

Referring to Table 13, the data show the utility of adding water-soluble organic solvents to decrease aluminum etching rates. Decreased aluminum etching rates are sometimes needed to completely avoid aluminum corrosion during the stripping process. The aluminum etching rate is inversely proportional to the amount of solvent used, regardless of solvent classification. A wide variety of water-soluble solvent types are illustrated below. The data also illustrate the use of optional water-soluble organic solvents of various types to obtain a desirable aluminum etching rate for the compositions invented herein.

EXAMPLE 14

Aqueous solution "G1" was prepared with 0.22 weight percent tetramethylammonium hydroxide (TMAH) and 0.14 weight percent (calculated as % SiO$_2$) tetramethylammonium silicate (TMAS) added with the remainder of this solution being water (solution pH=12.2).

Aqueous solution "G2" was prepared with 0.22 weight percent tetramethylammonium hydroxide (TMAH), 0.14 weight percent (calculated as % SiO$_2$) tetramethylammonium silicate (TMAS) and 0.10 weight percent of the nonionic surfactant Surfynol-465 added with the remainder of this solution being water (solution pH=12.2). Aqueous solution "G3" was prepared with 0.22 weight percent tetramethylammonium hydroxide (TMAH), 0.14 weight percent (calculated as % SiO$_2$) tetramethylammonium silicate (TMAS) and 0.10 weight percent of the nonionic surfactant Fluorad FC-170C (a product of the Industrial Chemical Products Division of 3M) added with the remainder of this solution being water (solution pH=12.2). Aqueous solution "G4" was prepared with 0.22 weight percent tetramethylammonium hydroxide (TMAH), 0.14 weight percent (calculated as % SiO$_2$) tetramethylammonium silicate (TMAS) and 0.042 (active) weight percent of the amphoteric surfactant Rewoteric AM KSF-40 (a product of Witco Corporation) added with the remainder of this solution being water (solution pH=12.2). Aqueous solution "G5" was prepared with 0.22 weight percent tetramethylammonium hydroxide (TMAH), 0.14 weight percent (calculated as % $SiO_2$) tetramethylammonium silicate (TMAS) and 0.026 (active)weight percent of the anionic surfactant Fluorad FC-93 (a product of the Industrial Chemical Products Division of 3M) added with the remainder of this solution being water (solution pH=12.2). Aqueous solution "G6" was prepared with 0.22 weight percent tetramethylammonium hydroxide (TMAH), 0.14 weight percent (calculated as % $SiO_2$) tetramethylammonium silicate (TMAS) and 0.037 (active)weight percent of the cationic surfactant Barquat CME-35 (a product of Lonza, Inc.) added with the remainder of this solution being water (solution pH=12.2). Each solution was placed into a 125 ml polyethylene bottle, loosely capped and placed into a oven set at 45° C. for one hour. A 0.05 mm×12 mm×50 mm. 99.8% pure aluminum foil coupon was washed with acetone, dried, then weighed on an analytical balance. After one hour of pre-heating each solution was removed from the oven and the aluminum foil coupon was then placed into the bottle, loosely re-capped and placed back into the oven. After one hour at about 45° C., the bottle was removed from the oven. The aluminum coupon was removed, rinsed with water, followed by an acetone rinse, dried and then weighed on an analytical balance. The relative corrosion rates were determined by weight loss. The results are shown in Table 14.

TABLE 14

Aluminum Foil Etch Rate Comparisons

| Solution | pH | Surfactant Tested | Surfactant Type | Amount of Active Surfactant Added (Weight %) | Relative Aluminum Corrosion Rate |
|---|---|---|---|---|---|
| G1 | 12.2 | — | — | 0 | 1 |
| G2 | 12.2 | Surfynol-465 | nonionic | 0.10 | 0.62 |
| G3 | 12.2 | FC-170C | nonionic | 0.10 | 0.75 |
| G4 | 12.2 | KSF-40 | amphoteric | 0.042 | 0.37 |
| G5 | 12.2 | FC-93 | anionic | 0.026 | 0.37 |
| G6 | 12.2 | CME-35 | cationic | 0.037 | 0 |

Referring to Table 14, the data show the utility of adding a surfactant to decrease aluminum etching rates. Decreased aluminum etching rates are sometimes needed to completely avoid aluminum corrosion during the stripping process. Useful aluminum etching rate suppression occurs for all four surfactant classifications. This is in addition to the expected desirable feature of improved sample wetting when a surfactant is present. The data also illustrate the use of optional surfactants of various types to obtain a desirable aluminum etching rate for the compositions invented herein.

EXAMPLE 15

Aqueous solution "F1" was prepared with 0.20 weight percent tetramethylammonium hydroxide (TMAH), 0.11 weight percent trans-(1,2-cyclohexylenedinitrilo)tetraacetic acid (CyDTA) and 0.07 weight percent of the nonionic surfactant Surfynol-465 added with the remainder of this solution being water (solution pH=12.3). Aqueous solution "F2" was prepared with 0.30 weight percent tetramethylammonium hydroxide (TMAH), 0.10 weight percent trans-(1, 2-cyclohexylenedinitrilo)tetraacetic acid (CyDTA), 0.14 weight percent (calculated as % $SiO_2$) tetramethylammonium silicate (TMAS) and 0.07 weight percent of the nonionic surfactant Surfynol-465 added with the remainder of this solution being water (solution pH=12.3). Aqueous solution "F3" was prepared with 0.29 weight percent tetramethylammonium hydroxide (TMAH), 0.10 weight percent trans-(1,2-cyclohexylenedinitrilo)tetraacetic acid (CyDTA), 0.14 weight percent (calculated as % $SiO_2$) tetramethylammonium silicate (TMAS), 3.0 weight percent glycerol and 0.07 weight percent of the nonionic surfactant Surfynol-465 added with the remainder of this solution being water (solution pH=12.1). Sections from the same Si(100) wafer with approximately 650 nm of thermal oxide were washed with acetone, dried, then measured with a Rudolph FTM Interferometer to determine the thermal oxide thickness. Four areas were measured and mapped for a follow-up measurement after treatment. Each sample was then placed into the bottle. loosely re-capped and placed into the oven, which was pre-set to 45° C. After 24 hours at about 45° C., the bottle was removed from the oven, sample removed, rinsed with water, followed by an acetone rinse, dried and then measured on the Interferometer. The relative corrosion rates were determined by the difference in thermal oxide film thickness averaged for four areas on the sample. The results are shown in Table 15.

TABLE 15

Thermal Oxide on Silicon Etch Rate Comparisons

| Solution | pH | Amount of Tetramethylammonium Silicate Added to Solution (Weight % as $SiO_2$) | Amount of Organic Co-solvent Added (Weight %) | Relative Average Thermal Oxide Corrosion Rate |
|---|---|---|---|---|
| F1 | 12.3 | — | 0 | 1 |
| F2 | 12.3 | 0.14 | 0 | 0.54 |
| F3 | 12.1 | 0.14 | 3 | 0.50 |

Referring to Table 15, the data show the advantage of the adding a silicate to prevent or moderate the corrosion of silicon dioxide that accompanies exposure to alkaline solutions. Silicon dioxide dielectrics are normally present on the integrated circuit surface during the stripping of metal lines or vias. Damage to these dielectrics must be avoided. The data also show that the addition of tetramethylammonium silicate to tetramethylammonium hydroxide based cleaning solutions inhibits the undesirable corrosion of a dielectric material that is commonly present in integrated circuits.

EXAMPLE 16

Residual organic contamination after cleaning was measured using Secondary Ion Mass Spectroscopy (SIMS). Silicon wafer samples that were sputtered with 0.35 micron films of aluminum-1% copper alloy were cleaned with silicate solution "A" and also with a commercial post etch residue remover, EKC-265™ (a product of EKC Technology, Inc.). EKC-265™ comprises about 5% of catechol, 15%–20% each of hydroxylamine and water, and the balance being 2-(2-aminoethoxy)ethanol. A wafer sample was placed into solution "A" at 35° C. for 5 minutes, followed by a 2 minute 0.2 micron filtered de-ionized water rinse and pressurized nitrogen dry. A second wafer sample was similarly processed in EKC-265™, using the time and temperature recommended by the manufacturer. A third untreated wafer piece. also from the same silicon wafer, was used as a control. The wafer samples were then analyzed by Dynamic-SIMS using an etch rate of 22.1 Angstroms per second with a dwell time of 0.5 seconds. The atomic abundance of the carbon-12 ejected from the surface was then used to compare carbon surface contamination of the three samples. The results are shown in Table 16.

TABLE 16

Relative Comparison of Residual Carbon Left on the Surface of a Wafer After Cleaning

| Solution | Time (Min.) | Temp. (° C.) | Relative Carbon Contamination Left After Cleaning |
|---|---|---|---|
| Untreated | — | — | 1 |
| A | 5 | 35 | 1.1 |
| EKC-265 ™ | 20 | 65 | 4.1 |

Referring to Table 16, the data show the superiority of the present invention for giving a surface free of organic contamination after cleaning and illustrate that the use of the compositions described herein results in very little contamination of the integrated circuit with carbon-containing (organic) impurities.

EXAMPLE 17

Aqueous solution "H1" was prepared with 0.27 weight percent tetramethylammonium hydroxide (TMAH), 0.092 weight percent trans-(1,2-cyclohexylenedinitrilo)tetraacetic acid (CyDTA), 0.062 weight percent of the non-ionic surfactant Surfynol-465, 0.13 weight percent (calculated as % $SiO_2$) tetramethylammonium silicate (TMAS) and 2.7 weight percent glycerol added with the remainder of this solution being water. Aqueous solution "H2" was prepared with 0.28 weight percent tetramethylammonium hydroxide (TMAH), 0.097 weight percent trans-(1,2-cyclohexylenedinitrilo)tetraacetic acid (CyDTA), 0.065 weight percent of the non-ionic surfactant Surfynol-465, 0.13 weight percent (calculated as % $SiO_2$) tetramethylammonium silicate (TMAS) and 2.9 weight percent glycerol added with the remainder of this solution being water. Aqueous solution "H3" was prepared with 0.32 weight percent tetramethylammonium hydroxide (TMAH), 0.11 weight percent trans-(1,2-cyclohexylenedinitrilo)tetraacetic acid (CyDTA), 0.075 weight percent of the non-ionic surfactant Surfynol-465, 0.15 weight percent (calculated as % $SiO_2$) tetramethylammonium silicate (TMAS) and 3.3 weight percent glycerol added with the remainder of this solution being water. Aqueous solution "H4" was prepared with 0.39 weight percent tetramethylarnmonium hydroxide (TMAH), 0.14 weight percent trans-(1,2-cyclohexylenedinitrilo)tetraacetic acid (CyDTA), 0.091 weight percent of the non-ionic surfactant Surfynol-465, 0.19 weight percent (calculated as % $SiO_2$) tetramethylammonium silicate (TMAS) and 4.0 weight percent glycerol added with the remainder of this solution being water. Aqueous solution "H5" was prepared with 0.58 weight percent tetramethylammonium hydroxide (TMAH), 0.20 weight percent trans-(1,2-cyclohexylenedinitrilo)tetraacetic acid (CyDTA), 0.14 weight percent of the non-ionic surfactant Surfynol-465, 0.28 weight percent (calculated as % $SiO_2$) tetramethylammonium silicate (TMAS) and 6.0 weight percent glycerol added with the remainder of this solution being water. Aqueous solution "H6" was prepared with 1.2 weight percent tetramethylammonium hydroxide (TMAH), 0.41 weight percent trans-(1,2-cyclohexylenedinitrilo)tetraacetic acid (CyDTA), 0.27 weight percent of the non-ionic surfactant Surfynol-465. 0.56 weight percent (calculated as % $SiO_2$) tetramethylammonium silicate (TMAS) and 12 weight percent glycerol added with the remainder of this solution being water. Aqueous solution "H7" was prepared with 5.1 weight percent tetramethylarnmonium hydroxide (TMAH), 1.8 weight percent trans-(1,2-cyclohexylenedinitrilo)tetraacetic acid (CyDTA), 2.4 weight percent (calculated as % $SiO_2$) tetramethylammonium silicate (TMAS) and 52 weight percent glycerol added with the remainder of this solution being water. Wafer #5 and #6 samples with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind, were used to evaluate the performance of the solutions. Wafer samples #7 and #8 with one-half micron wide by one micron deep holes (vias) through a dielectric material exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic residues behind. Wafer sample #9 with one micron wide by one micron deep tapered holes (vias) through a dielectric material exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic residues behind. A wafer sample was placed in the solution at 21–45° C. for 5–10 minutes, removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. The results are shown in Tables 17A–17E.

TABLE 17A

SEM Evaluation Results for Sample #5

| Solution | Time/ Temp. (min./ ° C.) | pH | TMAH (Wt. %) | TMAS (Wt. % as $SiO_2$) | Glycerol (Wt. %) | CyDTA (Wt. %) | Surf.-465 (Wt. %) | Post-Ash Residue Removed (%) | Via-base Aluminum Metal Corrosion |
|---|---|---|---|---|---|---|---|---|---|
| H1 | 5/21 | 12.1 | 0.27 | 0.13 | 2.7 | 0.092 | 0.062 | 100 | none |
| H3 | 5/22 | 12.1 | 0.32 | 0.15 | 3.3 | 0.11 | 0.075 | 100 | none |
| H4 | 5/22 | 12.2 | 0.39 | 0.19 | 4.0 | 0.14 | 0.091 | 100 | none |
| H5 | 5/22 | 12.3 | 0.58 | 0.28 | 6.0 | 0.20 | 0.14 | 100 | none |

TABLE 17A-continued

SEM Evaluation Results for Sample #5

| Solution | Time/Temp. (min./° C.) | pH | TMAH (Wt. %) | TMAS (Wt. % as SiO$_2$) | Glycerol (Wt. %) | CyDTA (Wt. %) | Surf.-465 (Wt. %) | Post-Ash Residue Removed (%) | Via-base Aluminum Metal Corrosion |
|---|---|---|---|---|---|---|---|---|---|
| H6 | 5/22 | 12.5 | 1.2 | 0.56 | 12 | 0.41 | 0.27 | 100 | none |
| H7 | 5/21 | 13.0 | 5.1 | 2.4 | 52 | 1.8 | 0 | 100 | none |

TABLE 17B

SEM Evaluation Results for Sample #6

| Solution | Time/Temp. (min./° C.) | pH | TMAH (Wt. %) | TMAS (Wt. % as SiO$_2$) | Glycerol (Wt. %) | CyDTA (Wt. %) | Surf.-465 (Wt. %) | Post-Ash Residue Removed (%) | Via-base Aluminum Metal Corrosion |
|---|---|---|---|---|---|---|---|---|---|
| H1 | 10/45 | 12.1 | 0.27 | 0.13 | 2.7 | 0.092 | 0.062 | 100 | very slight |
| H3 | 10/45 | 12.1 | 0.32 | 0.15 | 3.3 | 0.11 | 0.075 | 100 | very slight |
| H4 | 10/45 | 12.2 | 0.39 | 0.19 | 4.0 | 0.14 | 0.091 | 100 | very slight |
| H5 | 5/45 | 12.3 | 0.58 | 0.28 | 6.0 | 0.20 | 0.14 | 100 | very slight |
| H6 | 5/45 | 12.5 | 1.2 | 0.56 | 12 | 0.41 | 0.27 | 100 | very slight |
| H7 | 10/45 | 13.0 | 5.1 | 2.4 | 52 | 1.8 | 0 | 100 | none |

TABLE 17C

SEM Evaluation Results for Sample #7

| Solution | Time/Temp. (min./° C.) | pH | TMAH (Wt. %) | TMAS (Wt. % as SiO$_2$) | Glycerol (Wt. %) | CyDTA (Wt. %) | Surf.-465 (Wt. %) | Post-Ash Residue Removed (%) | Via-base Aluminum Metal Corrosion |
|---|---|---|---|---|---|---|---|---|---|
| H1 | 10/21 | 12.1 | 0.27 | 0.13 | 2.7 | 0.092 | 0.062 | 100 | very slight |
| H3 | 10/22 | 12.1 | 0.32 | 0.15 | 3.3 | 0.11 | 0.075 | 100 | very slight |
| H4 | 10/22 | 12.2 | 0.39 | 0.19 | 4.0 | 0.14 | 0.091 | 100 | very slight |
| H5 | 10/22 | 12.3 | 0.58 | 0.28 | 6.0 | 0.20 | 0.14 | 100 | very slight |
| H6 | 10/22 | 12.5 | 1.2 | 0.56 | 12 | 0.41 | 0.27 | 100 | very slight |
| H7 | 10/21 | 13.0 | 5.1 | 2.4 | 52 | 1.8 | 0 | 100 | very slight |

TABLE 17D

SEM Evaluation Results for Sample #8

| Solution | Time/Temp. (min./° C.) | pH | TMAH (Wt. %) | TMAS (Wt. % as SiO$_2$) | Glycerol (Wt. %) | CyDTA (Wt. %) | Surf.-465 (Wt. %) | Post-Ash Residue Removed (%) | Via-base Aluminum Metal Corrosion |
|---|---|---|---|---|---|---|---|---|---|
| H1 | 10/45 | 12.1 | 0.27 | 0.13 | 2.7 | 0.092 | 0.062 | 85 | slight |
| H2 | 10/45 | 12.1 | 0.28 | 0.13 | 2.9 | 0.097 | 0.065 | 100 | slight |
| H3 | 10/45 | 12.1 | 0.32 | 0.15 | 3.3 | 0.11 | 0.075 | 100 | slight |
| H4 | 10/45 | 12.2 | 0.39 | 0.19 | 4.0 | 0.14 | 0.091 | 100 | slight |
| H5 | 10/45 | 12.3 | 0.58 | 0.28 | 6.0 | 0.20 | 0.14 | 100 | slight |
| H6 | 10/45 | 12.5 | 1.2 | 0.56 | 12 | 0.41 | 0.27 | 100 | slight |
| H7 | 10/45 | 13.0 | 5.1 | 2.4 | 52 | 1.8 | 0 | 100 | slight |

TABLE 17E

SEM Evaluation Results for Sample #9

| Solution | Time/ Temp. (min./ ° C.) | pH | TMAH (Wt. %) | TMAS (Wt. % as SiO$_2$) | Glycerol (Wt. %) | CyDTA (Wt. %) | Surf.-465 (Wt. %) | Post-Ash Residue Removed (%) | Via-base Aluminum Metal Corrosion |
|---|---|---|---|---|---|---|---|---|---|
| H1 | 10/23 | 12.1 | 0.27 | 0.13 | 2.7 | 0.092 | 0.062 | 99.5 | slight |
| H2 | 10/23 | 12.1 | 0.28 | 0.13 | 2.9 | 0.097 | 0.065 | 99.2 | slight |
| H3 | 10/22 | 12.1 | 0.32 | 0.15 | 3.3 | 0.11 | 0.075 | 100 | very slight |
| H4 | 10/22 | 12.2 | 0.39 | 0.19 | 4.0 | 0.14 | 0.091 | 100 | none |
| H5 | 10/22 | 12.3 | 0.58 | 0.28 | 6.0 | 0.20 | 0.14 | 100 | none |
| H6 | 10/22 | 12.5 | 1.2 | 0.56 | 12 | 0.41 | 0.27 | 100 | none |
| H7 | 10/21 | 13.0 | 5.1 | 2.4 | 52 | 1.8 | 0 | 95 | very slight |

Referring to Tables 17A–17E, the data show that by varying the pH and concentrations of each of the components allowed seven different formulations to successfully clean residues from several different oxygen plasma-ashed wafer samples without unacceptable aluminum corrosion occurring.

EXAMPLE 18

Aqueous solution "H8" was prepared with 5.1 weight percent tetramethylammonium hydroxide (TMAH), 1.8 weight percent trans-(1,2-cyclohexylenedinitrilo)tetraacetic acid (CyDTA), 2.4 weight percent (calculated as % SiO$_2$) tetramethylammonium silicate (TMAS) and 52 weight percent dimethyl sulfoxide (DMSO) added with the remainder of this solution being water. Aqueous solution "H9" was prepared with 0.58 weight percent tetramethylammonium hydroxide (TMAH), 0.20 weight percent trans-(1,2-cyclohexylenedinitrilo)tetraacetic acid (CyDTA), 0.14 weight percent of the non-ionic surfactant Surfynol-465. 0.28 weight percent (calculated as % SiO$_2$) tetramethylammonium silicate (TMAS) and 6.0 weight percent glycerol added with the remainder of this solution being water. Aqueous solution "H10" was prepared with 0.88 weight percent tetramethylammonium hydroxide (TMAH), 0.30 weight percent trans-(1,2-cyclohexylenedinitrilo)tetraacetic acid (CyDTA), 0.20 weight percent of the non-ionic surfactant Surfynol-465, 0.42 weight percent (calculated as % SiO$_2$) tetramethylammonium silicate (TMAS) and 9.0 weight percent glycerol added with the remainder of this solution being water. Wafer sample #10 with one micron wide by two micron deep holes (vias) through a photoresist and dielectric material exposing Aluminum-Copper metal at the base had been previously processed as follows (a) metallization with aluminum-copper followed by titanium nitride (b) coated with silicon oxide dielectric using chemical vapor deposition (c) lithographic patterning of vias using an approximately one micron thick layer of photoresist material (d) pattern transfer to the dielectric layer using a reactive ion etching (e) Hard-bake of photoresist at high temperature to remove solvents, but leaving a mainly organic photoresist layer behind. This sample were used to evaluate the performance of the solutions below. A wafer sample was placed in the solution at 45–65° C. for 20–30 minutes, removed, rinsed with de-ionized water and dried with pressurized nitrogen gas. After drying, the sample was inspected on a Scanning Electron Microscope (SEM) to determine the extent of cleaning and/or corrosion of the features. The results are shown in Table 18.

TABLE 18

SEM Evaluation Results

| Solution | Time (min.) | Temp. (° C.) | Organic Co-Solvent Used | Co-Solvent Content (Weight %) | Photoresist Residue Removed (%) | Via-base Aluminum Metal Corrosion |
|---|---|---|---|---|---|---|
| L | 20 | 45 | Glycerol | 3.0 | 85 | none |
| H9 | 30 | 65 | Glycerol | 6.0 | 88 | none |
| H10 | 30 | 65 | Glycerol | 9.0 | 88 | none |
| H6 | 20 | 65 | Glycerol | 12 | 88 | none |
| H7 | 10 | 45 | Glycerol | 52 | 88 | none |
| H7 | 20 | 45 | Glycerol | 52 | 90 | none |
| H7 | 30 | 65 | Glycerol | 52 | 92 | none |
| H8 | 30 | 65 | DMSO | 52 | 100 | slight |

Referring to Table 18, the data demonstrates the ability of this invention to clean an organic photoresist layer from a semiconductor wafer surface before the sample has been oxygen plasma ashed, while preventing or moderating the corrosion of the aluminum features.

EXAMPLE 19

Aqueous solution "H11" was prepared with 6.2 weight percent tetramethylammonium hydroxide (TMAH), 2.1 weight percent trans-(1,2-cyclohexylenedinitrilo)tetraacetic acid (CyDTA), 64 weight percent glycerol and 2.9 weight percent (calculated as % $SiO_2$) colloidal silica sol (with a particle size of 20 nm) added with the remainder of this solution being water. The pH of solution "H11" is about 13.1. Wafer samples #5 and #6 with one micron wide features and Aluminum-Copper raised lines capped with titanium-nitride, that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind were used. Treatments on each of the samples were done for 5–10 minutes at 22–45° C., removed, rinsed with de-ionized water and dried with pressurized nitrogen gas. After drying, the sample was inspected on a Scanning Electron Microscope (SEM) to determine the extent of cleaning and/or corrosion of the aluminum-copper metal features. Results were similar to those obtained for solution "H7" in Example 17 and shows that colloidal silica can be used as a source of water-soluble metal ion-free silicate in the present invention.

EXAMPLE 20

Aqueous solution "L" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465, 0.14 weight percent (calculated as % $SiO_2$) tetramethylammonium silicate (TMAS) and 3 weight percent glycerol added with the remainder of this solution being water and has a pH of about 12.1. Aqueous solution "Z" was prepared with 1.3 weight percent tetramethylammonium hydroxide (TMAH), 0.58 weight percent trans-(1, 2-cyclohexylenedinitrilo)tetraacetic acid (CyDTA) added (remainder of this solution being water) and has a pH of about 13.0. Aqueous solution "M1" was prepared with 1.2 weight percent tetramethylammonium hydroxide (TMAH), 0.45 weight percent trans-(1,2-cyclohexylenedinitrilo)-tetraacetic acid (CyDTA), 0.14 weight percent (calculated as % $SiO_2$) tetramethylammonium silicate (TMAS), 18.5 weight percent hydroxylamine and 0.07 weight percent of the non-ionic surfactant Surfynol-465 (remainder of this solution being water) and has a pH of about 12.1. Aqueous solution "P1" was prepared with 2.2 weight percent tetramethylammonium hydroxide (TMAH), 0.11 weight percent trans-(1,2-cyclohexylenedinitrilo)-tetraacetic acid (CyDTA), 0.14 weight percent (calculated as % $SiO_2$) tetramethylammonium silicate (TMAS) and 1.6 weight percent hydrogen peroxide (remainder of this solution being water) and has a pH of about 11.5. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 22–65° C. for 20 minutes, removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 19.

TABLE 19

| | Weight Percent Tetramethyl-ammonium Silicate Added (calculated as % $SiO_2$) | pH | Time (min.)/ Temp. (° C.) | Titanium Residue Removal Enhancer Added | Post-Ash Residue Removed (%) | Aluminum Metal Corrosion (% Metal Loss) |
|---|---|---|---|---|---|---|
| Solution | | | | | | |
| Z | 0 | 13.0 | 20/22 | NONE | 0 | 100 (severe) |
| Z | 0 | 13.0 | 20/65 | NONE | 98 | 100 (severe) |
| L | 0.14 | 12.1 | 20/45 | NONE | 10 | 30 (moderate) |
| L | 0.14 | 12.1 | 20/65 | NONE | 20 | 50 (moderate) |
| M1 | 0.14 | 12.1 | 20/35 | Hydroxylamine | 100 | 3 (very slight) |
| P1 | 0.14 | 11.5 | 20/35 | Hydrogen Peroxide | 100 | 1 (very slight) |

Referring to Table 19, the data shows the ability of hydroxylamine or hydrogen peroxide to enhance the removal of the titanium containing residues at low temperatures.

EXAMPLE 21

Aqueous solution "M2" was prepared with 0.67 weight percent tetramethylammonium hydroxide (TMAH), 0.46 weight percent trans-(1,2-cyclohexylenedinitrilo)-tetraacetic acid (CyDTA), 0.14 weight percent (calculated as % SiO$_2$) tetramethylammonium silicate (TMAS), 1.0 weight percent hydroxylamine and 0.07 weight percent of the non-ionic surfactant Surfynol-465 (remainder of this solution being water) and has a pH of about 12.1. Aqueous solution "M3" was prepared with 0.94 weight percent tetramethylammonium hydroxide (TMAH), 0.45 weight percent trans-(1,2-cyclohexylenedinitrilo)-tetraacetic acid (CyDTA), 0.20 weight percent (calculated as % SiO$_2$) tetramethylammonium silicate (TMAS), 5.1 weight percent hydroxylamine and 0.1 weight percent of the non-ionic surfactant Surfynol-465 (remainder of this solution being water) and has a pH of about 12.1. Aqueous solution "M4" was prepared with 1.1 weight percent tetramethylammonium hydroxide (TMAH), 0.46 weight percent trans-(1,2-cyclohexylenedinitrilo)-tetraacetic acid (CyDTA), 0.18 weight percent (calculated as % SiO$_2$) tetramethylammonium silicate (TMAS), 10.0 weight percent hydroxylamine and 0.09 weight percent of the non-ionic surfactant Surfynol-465 (remainder of this solution being water) and has a pH of about 12.1. Aqueous solution "M5" was prepared with 1.3 weight percent tetramethylammonium hydroxide (TMAH), 0.42 weight percent trans-(1,2-cyclohexylenedinitrilo)-tetraacetic acid (CyDTA), 0.14 weight percent (calculated as % SiO$_2$) tetramethylamrnonium silicate (TMAS) and 47.3 weight percent hydroxylamine (remainder of this solution being water) and has a pH of about 12.1. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 35° C. for 20 minutes, removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 20.

Referring to Table 20, the data shows the ability of hydroxylamine to enhance the removal of the titanium containing residues at low temperatures.

EXAMPLE 22

Aqueous solution "M6" was prepared with 0.82 weight percent tetramethylammonium hydroxide (TMAH), 0.14 weight percent (calculated as % SiO$_2$) tetramethylammonium silicate (TMAS), 18.8 weight percent hydroxylamine and 0.07 weight percent of the non-ionic surfactant Surfynol-465 (remainder of this solution being water) and has a pH of about 12.1. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 35° C. for 20 minutes, removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 21.

TABLE 20

FE-SEM Evaluation Results

| Solution | Weight Percent Tetramethylammonium Silicate Added (calculated as % SiO$_2$) | pH | Time (min.)/ Temp. (° C.) | Amount of Titanium Residue Removal Enhancer Hydroxylamine Added (Weight %) | Post-Ash Residue Removed (%) | Aluminum Metal Corrosion (% Metal Loss) |
|---|---|---|---|---|---|---|
| M2 | 0.14 | 12.1 | 20/35 | 1.0 | 60 | 3 (slight) |
| M3 | 0.20 | 12.1 | 20/35 | 5.1 | 96 | 1 (very slight) |
| M4 | 0.18 | 12.1 | 20/35 | 10.0 | 99 | 3 (slight) |
| M1 | 0.14 | 12.1 | 20/35 | 18.5 | 100 | 3 (slight) |
| M5 | 0.14 | 12.1 | 20/35 | 47.3 | 40 | 0 |

TABLE 21

FE-SEM Evaluation Results

| Solution | Weight Percent Tetramethyl-ammonium Silicate Added (calculated as % SiO$_2$) | Amount of Metal Chelating Agent CyDTA Added (Weight %) | Titanium Residue Removal Enhancer Hydroxylamine Added (Weight %) | Post-Ash Residue Removed (%) | Aluminum Metal Corrosion (% Metal Loss) |
|---|---|---|---|---|---|
| M1 | 0.14 | 0.45 | 18.5 | 100 | 3 (slight) |
| M6 | 0.14 | 0 | 18.8 | 100 | 4 (slight) |

Referring to Table 21, the data shows that good stripping performance can be obtained over a range of CyDTA concentrations. Thus, the amount of chelating agent present can be adjusted to accommodate the sample to be cleaned. More difficult samples may require this optional ingredient to accomplish complete cleaning. The data also illustrate the optional use of a chelating agent in the compositions disclosed herein.

EXAMPLE 23

Aqueous solution "M7" was prepared with 6.0 weight percent tetramethylammonium hydroxide (TMAH), 0.35 weight percent trans-(1,2-cyclohexylenedinitrilo)-tetraacetic acid (CyDTA), 1.2 weight percent (calculated as % SiO$_2$) tetramethylammonium silicate (TMAS), 17.7 weight percent hydroxylamine and 0.06 weight percent of the non-ionic surfactant Surfynol-465 (remainder of this solution being water) and has a pH of about 13.0. Aqueous solution "M8" was prepared with 7.1 weight percent tetramethylammonium hydroxide (TMAH), 0.46 weight percent trans-(1,2-cyclohexylenedinitrilo)-tetraacetic acid (CyDTA), 2.7 weight percent (calculated as % SiO$_2$) tetramethylammonium silicate (TMAS) and 19.1 weight percent hydroxyl amine (remainder of this solution being water) and has a pH of about 13.0. Aqueous solution "M9" was prepared with 8.2 weight percent tetramethylammonium hydroxide (TMAH), 0.45 weight percent trans-(1,2-cyclohexylenedinitrilo)-tetraacetic acid (CyDTA), 4.1 weight percent (calculated as % SiO$_2$) tetramethylammonium silicate (TMAS) and 19.0 weight percent hydroxylamine (remainder of this solution being water) and has a pH of about 13.0. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 35° C. for 20 minutes. removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 22.

TABLE 22

FE-SEM Evaluation Results

| Solution | Weight Percent Tetramethyl-ammonium Silicate Added (calculated as % SiO$_2$) | pH | Time (min.)/ Temp. (° C.) | Titanium Residue Removal Enhancer Hydroxylamine Added (Weight %) | Post-Ash Residue Removed (%) | Aluminum Metal Corrosion (% Metal Loss) |
|---|---|---|---|---|---|---|
| M7 | 1.2 | 13.0 | 20/35 | 17.7 | 100 | 100 (severe) |
| M8 | 2.7 | 13.0 | 20/35 | 19.1 | 100 | 80 (severe) |
| M9 | 4.1 | 13.0 | 20/35 | 19.0 | 100 | 40 (moderate) |

Referring to Table 22, the data shows the ability of tetramethylammonium silicate to prevent or moderate the corrosion of the exposed aluminum at the base of the via even when the formulation pH is very high.

EXAMPLE 24

Aqueous solution "M10" was prepared with 0.34 weight percent tetramethylammonium hydroxide (TMAH), 0.47 weight percent trans-(1,2-cyclohexylenedinitrilo)-tetraacetic acid (CyDTA), 0.01 weight percent (calculated as % $SiO_2$) tetramethylammonium silicate (TMAS), 18.6 weight percent hydroxylamine and 0.06 weight percent of the non-ionic surfactant Surfynol-465 (remainder of this solution being water) and has a pH of about 10.1. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 20–65° C. for 5–30 minutes, removed, rinsed with de-ionized water and dried with 20 pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 23.

TABLE 23

FE-SEM Evaluation Results

| Solution | Weight Percent Tetramethyl-ammonium Silicate Added (calculated as % $SiO_2$) | pH | Time (min.)/ Temp. (° C.) | Titanium Residue Removal Enhancer Hydroxylamine Added (Weight %) | Post-Ash Residue Removed (%) | Aluminum Metal Corrosion (% Metal Loss) |
|---|---|---|---|---|---|---|
| M10 | 0.01 | 10.1 | 20/35 | 18.6 | 5 | 0 |
| M10 | 0.01 | 10.1 | 20/45 | 18.6 | 90 | 0 |
| M10 | 0.01 | 10.1 | 20/55 | 18.6 | 100 | 2 (slight) |
| M10 | 0.01 | 10.1 | 10/65 | 18.6 | 100 | 1 (very slight) |
| M9 | 4.1 | 13.0 | 5/21 | 19.0 | 0 | 0 |
| M9 | 4.1 | 13.0 | 20/20 | 19.0 | 99 | 2 (slight) |
| M9 | 4.1 | 13.0 | 30/20 | 19.0 | 100 | 10 (light) |

Referring to Table 23, the data shows at high pH, higher concentrations of tetramethylammonium silicate can be used to inhibit aluminum corrosion. The data also shows that at high pH, lower operating temperatures can be used.

EXAMPLE 25

Aqueous solution "P1" was prepared with 2.2 weight percent tetramethylammonium hydroxide (TMAH), 0.11 weight percent trans-(1,2-cyclohexylenedinitrilo)-tetraacetic acid (CyDTA), 0.14 weight percent (calculated as % $SiO_2$) tetramethylammonium silicate (TMAS) and 1.6 weight percent hydrogen peroxide (remainder of this solution being water) and has a pH of about 11.5. Aqueous solution "P2" was prepared with 9.7 weight percent tetramethylammonium hydroxide (TMAH), 0.11 weight percent trans-(1,2-cyclohexylenedinitrilo)-tetraacetic acid (CyDTA), 0.14 weight percent (calculated as % $SiO_2$) tetramethylammonium silicate (TMAS) and 9.4 weight percent hydrogen peroxide (remainder of this solution being water) and has a pH of about 11.5. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 21–35° C. for 20 minutes, removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 24.

TABLE 24

FE-SEM Evaluation Results

| Solution | Weight Percent Tetramethyl-ammonium Silicate Added (calculated as % SiO$_2$) | pH | Time (min.)/ Temp. (° C.) | Titanium Residue Removal Enhancer Hydrogen Peroxide Added (Weight %) | Post-Ash Residue Removed (%) | Aluminum Metal Corrosion (% Metal Loss) |
|---|---|---|---|---|---|---|
| P1 | 0.14 | 11.5 | 20/22 | 1.6 | 99 | 0 |
| P1 | 0.14 | 11.5 | 20/35 | 1.6 | 100 | 1 (very slight) |
| P2 | 0.14 | 11.5 | 20/21 | 9.4 | 99 | 0 |

Referring to Table 24, the data shows that a range of hydrogen peroxide concentrations are useful for the removal of the titanium containing residues in the vias.

EXAMPLE 26

Aqueous solution "P3" was prepared with 3.5 weight percent tetramethylammonium hydroxide (TMAH), 0.10 weight percent trans-(1,2-cyclohexylenedinitrilo)-tetraacetic acid (CyDTA), 0.14 weight percent (calculated as % SiO$_2$) tetramethylammonium silicate (TMAS) and 1.5 weight percent hydrogen peroxide (remainder of this solution being water) and has a pH of about 12.2. Aqueous solution "P4" was prepared with 3.9 weight percent tetramethylammonium hydroxide (TMAH), 0.096 weight percent trans-(1,2-cyclohexylenedinitrilo)-tetraacetic acid (CyDTA), 0.59 weight percent (calculated as % SiO$_2$) tetramethylammonium silicate (TMAS) and 1.4 weight percent hydrogen peroxide (remainder of this solution being water) and has a pH of about 12.2. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 22° C. for 10 minutes, removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 25.

TABLE 25

FE-SEM Evaluation Results

| Solution | Weight Percent Tetramethyl-ammonium Silicate Added (calculated as % SiO$_2$) | pH | Time (min.)/ Temp. (° C.) | Titanium Residue Removal Enhancer Hydrogen Peroxide Added (Weight %) | Post-Ash Residue Removed (%) | Aluminum Metal Corrosion (% Metal Loss) |
|---|---|---|---|---|---|---|
| P1 | 0.14 | 11.5 | 10/22 | 1.6 | 99 | 0 |
| P3 | 0.14 | 12.2 | 10/22 | 1.5 | 99 | 100 (severe) |
| P4 | 0.59 | 12.2 | 10/22 | 1.4 | 99 | 6 (light) |

Referring to Table 25, the data shows that higher concentrations of tetramethylammonium silicate can be used to inhibit aluminum corrosion when hydrogen peroxide is present.

EXAMPLE 27

Aqueous solution "P5" was prepared with 2.1 weight percent tetramethylammonium hydroxide (TMAH), 0.14 weight percent (calculated as % SiO$_2$) tetramethylammonium silicate (TMAS) and 1.5 weight percent hydrogen peroxide (remainder of this solution being water) and has a pH of about 11.5. Aqueous solution "P6" was prepared with 2.4 weight percent tetramethylammonium hydroxide (TMAH), 0.53 weight percent trans-(1,2-cyclohexylenedinitrilo)-tetraacetic acid (CyDTA), 0.14 weight percent (calculated as % SiO$_2$) tetramethylammonium silicate (TMAS) and 1.6 weight percent hydrogen peroxide (remainder of this solution being water) and has a pH of about 11.5. Aqueous solution "P7" was prepared with 2.9 weight percent tetramethylammonium hydroxide (TMAH), 1.4 weight percent trans-(1,2-cyclohexylenedinitrilo)-tetraacetic acid (CyDTA), 0.14 weight percent (calculated as % SiO$_2$) tetramethylammonium silicate (TMAS) and 1.5 weight percent hydrogen peroxide (remainder of this solution being water) and has a pH of about 11.5. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 21–23° C. for 20 minutes, removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 26.

cyclohexylenedinitrilo)-tetraacetic acid (CyDTA), 0.12 weight percent (calculated as % $SiO_2$) tetramethylammonium silicate (TMAS) and 15.7 weight percent formaldehyde (remainder of this solution being water) and has a pH of about 12.1. Aqueous solution "P10" was prepared with 0.26 weight percent tetramethylammonium hydroxide (TMAH), 11.5 weight percent trans-(1,2-cyclohexylenedinitrilo)-tetraacetic acid (CyDTA), 0.13 weight percent (calculated as % $SiO_2$) tetramethylammonium silicate (TMAS) and 16.7 weight percent methylamine (remainder of this solution being water) and has a pH of about 12.1. Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to

TABLE 26

FE-SEM Evaluation Results

| Solution | Weight Percent Tetramethyl-ammonium Silicate Added (calculated as % $SiO_2$) | Amount of Metal Chelating Agent CyDTA Added (Weight %) | Titanium Residue Removal Enhancer Hydrogen Peroxide Added (Weight %) | Post-Ash Residue Removed (%) | Aluminum Metal Corrosion (% Metal Loss) |
|---|---|---|---|---|---|
| P5 | 0.14 | 0 | 1.5 | 99 | 0 |
| P1 | 0.14 | 0.11 | 1.6 | 99 | 0 |
| P6 | 0.14 | 0.53 | 1.6 | 97 | 0 |
| P7 | 0.14 | 1.4 | 1.5 | 99 | 0 |

Referring to Table 26. the data shows that a range of CyDTA concentrations are useful.

EXAMPLE 28

Aqueous solution "P8" was prepared with 0.40 weight percent tetramethylammonium hydroxide (TMAH), 0.10 weight percent trans-(1,2-cyclohexylenedinitrilo)-tetraacetic acid (CyDTA), 0.14 weight percent (calculated as % $SiO_2$) tetramethylammonium silicate (TMAS) and 19.2 weight percent hydrazine (remainder of this solution being water) and has a pH of about 12.1. Aqueous solution "P9" was prepared with 4.33 weight percent tetramethylammonium hydroxide (TMAH), 0.088 weight percent trans-(1,2- remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 35° C. for 20–30 minutes, removed, rinsed with de-ionized water and dried with pressurized nitrogen gas. After drying, the sample vias were cross-sectioned and then inspected on a Field Emission Scanning Electron Microscope (FE-SEM) to determine the extent of cleaning and/or corrosion of the features. The results are shown in Table 27.

TABLE 27

FE-SEM Evaluation Results

| Solution | Weight Percent Tetramethyl-ammonium Silicate Added (calculated as % $SiO_2$) | pH | Time (min.)/ Temp. (° C.) | Potential Titanium Residue Removal Enhancer Added | Post-Ash Residue Removed (%) | Aluminum Metal Corrosion (% Metal Loss) |
|---|---|---|---|---|---|---|
| P8 | 0.14 | 12.1 | 30/35 | hydrazine | 0 | 0 |
| P9 | 0.12 | 12.1 | 30/35 | formaldehyde | 5 | 50 (moderate) |
| P10 | 0.13 | 12.1 | 20/35 | methylamine | 0 | 0 |

Referring to Table 27, the data shows that other small molecules were ineffective for titanium residue removal. Like hydroxylamine, hydrazine is a powerful reducing agent. Hydrazine's lack of effectiveness was unexpected and demonstrates the uniqueness of hydroxylamine and hydrogen peroxide for enabling the titanium containing residues found in wafer sample #11 to be cleaned from the vias using silicate-containing formulations.

EXAMPLE 29

Aqueous solution "L" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465, 0.14 weight percent (calculated as % $SiO_2$) tetramethylammonium silicate (TMAS) and 3 weight percent glycerol added with the remainder of this solution being water and has a pH of about 12.1. Aqueous solution "M1" was prepared with 1.2 weight percent tetramethylammonium hydroxide (TMAH), 0.45 weight percent trans-(1,2-cyclohexylenedinitrilo)-tetraacetic acid (CyDTA), 0.14 weight percent (calculated as % $SiO_2$) tetramethylammonium silicate (TMAS), 18.5 weight percent hydroxylamine and 0.07 weight percent of the non-ionic surfactant Surfynol-465 (remainder of this solution being water) and has a pH of about 12.1. Aqueous solution "P8" was prepared with 0.40 weight percent tetramethylammonium hydroxide (TMAH), 0.10 weight percent trans-(1,2-cyclohexylenedinitrilo)-tetraacetic acid (CyDTA), 0.14 weight percent (calculated as % $SiO_2$) tetramethylammonium silicate (TMAS) and 19.2 weight percent hydrazine (remainder of this solution being water) and has a pH of about 12.1. Aqueous solution "S1" was prepared by combining 583 grams de-ionized water, 7.8 grams 25% aqueous tetramethylammonium hydroxide (TMAH) and 8.6 grams tetramethylammonium silicate (TMAS, 10.0% as $SiO_2$) and had a pH of 12.5. Aqueous solution "S2" was prepared by combining 99.0 grams of solution "S1" and 2.5 grams of β-Cyclodextrin (solution pH=12.1). Aqueous solution "S3" was prepared by combining 99.0 grams of solution "S1" and 2.5 grams of Sodium Hypophosphite (solution pH=12.3). Aqueous solution "S4" was prepared by combining 99.0 grams of solution "S1" and 2.5 grams of Sodium Dithionite (solution pH=6.7). Aqueous solution "S5" was prepared by combining 99.0 grams of solution "S1" and 2.5 grams of Sodium Sulfite (solution pH=12.3). Aqueous stock solution "S5b" was prepared by combining 1,775.2 grams de-ionized water, 96.0 grams 25% aqueous tetramethylammonium hydroxide (TMAH), 8.8 grams trans-(1,2-cyclohexylenedinitrilo)-tetraacetic acid (CyDTA) and 114.8 grams tetramethylammonium silicate (TMAS, 10.0% as $SiO_2$). Aqueous stock solution "S5c" was prepared by combining 900 ml de-ionized water and 300 ml solution "S5b". Aqueous solution "S6" was prepared by combining 80.0 grams solution "S5c", 5.0 grams L-ascorbic acid and 18.2 grams 25% aqueous tetramethylammonium hydroxide (TMAH) (solution pH=12.3). Aqueous solution "S7" was prepared by combining 80.0 grams solution "S5c", 5.0 grams hydroquinone and 27.1 grams 25% aqueous tetramethylammonium hydroxide (TMAH) (solution pH=12.4). Aqueous solution "S8" was prepared by combining 80.0 grams solution "S5c", 5.0 grams L-(+)-cysteine and 29.6 grams 25% aqueous tetramethylammonium hydroxide (TMAH) (solution pH=12.4). Aqueous solution "S9" was prepared by combining 80.0 grams solution "S5c", 10.0 grams Ammonium Persulfate and 32.9 grams 25% aqueous tetramethylammonium hydroxide (TMAH) (solution pH=12.6). Aqueous solution "S10" was prepared by combining 80.0 grams solution "S5c", 5.0 grams Nitric Acid and 10.2 grams tetramethylammonium hydroxide pentahydrate (TMAH) (solution pH=12.4). Aqueous solution "S11" was prepared by combining 90.0 grams solution "S5c", 5.0 grams and 19.2 grams 25% aqueous tetramethylammonium hydroxide (TMAH) (solution pH=12.3). Aqueous solution "S 12" was prepared by combining 80.0 grams solution "S5c", 5.0 grams 88% Formic Acid, 10.0 grams 25% aqueous tetramethylammonium hydroxide (TMAH) and 12.7 grams tetramethylammonium hydroxide pentahydrate (TMAH) (solution pH=12.6). Aqueous solution "S13" was prepared by combining 80.0 grams solution "S5c", 5.0 grams Sulfuric Acid and 17.5 grams tetramethylammonium hydroxide pentahydrate (TMAH) (solution pH=12.3). Aqueous solution "S14" was prepared by combining 80.0 grams solution "S5c", 5.0 grams Phosphoric Acid and 20.1 grams tetramethylammonium hydroxide pentahydrate (TMAH) (solution pH=12.3). Aqueous solution "S15" was prepared by combining 80.0 grams solution "S5c", 6.0 grams Oxalic Acid Dihydrate. 16.0 grams 25% aqueous tetramethylammonium hydroxide (TMAH) and 9.3 grams tetramethylammonium hydroxide pentahydrate (TMAH) (solution pH=12.6). Aqueous solution "S16" was prepared by combining 80.0 grams solution "S5c", 5.0 grams Catechol and 16.1 grams 25% aqueous tetramethylammonium hydroxide (TMAH) (solution pH=12.4). Each solution was placed into a 125 ml polyethylene bottle, tightly capped and placed into a oven set at 45° C. for 1 hour of pre-heating. A 0.025 mm×13 mm×50 mm, 99.94% pure titanium foil coupon was washed with de-ionized water, acetone, dried, then weighed on an analytical balance. After one hour of pre-heating each solution was removed from the oven and the titanium foil coupon was then placed into the bottle. tightly re-capped and placed back into the oven. After 24 hours at about 45° C., the bottle was removed from the oven. The titanium foil coupon was removed, rinsed with de-ionized water, followed by an acetone rinse, dried and then weighed on an analytical balance. The relative corrosion rates were determined by weight loss. The results are shown in Table 28.

TABLE 28

Titanium Foil Etch Rate Comparisons

| Solution | pH | Potential Titanium Residue Removal Enhancer Added | Relative Titanium Corrosion Rate (all relative to Solution L) |
|---|---|---|---|
| L | 12.1 | NONE | 1 |
| A | 12.2 | NONE | 1.3 |
| P8 | 12.1 | hydrazine | 0 |
| S1 | 12.5 | NONE | 1.7 |
| S2 | 12.2 | β-Cyclodextrin | 0.7 |
| S3 | 6.7 | Sodium Hypophosphite | 0.7 |
| S4 | 12.3 | Sodium Dithionite | 1.7 |
| S5 | 12.3 | Sodium Sulfite | 1.7 |
| S6 | 12.3 | Ascorbic Acid | 0 |
| S7 | 12.3 | Hydroquinone | 0 |
| S8 | 12.4 | Cysteine | 0 |
| S9 | 12.2 | Ammonium Persulfate | 0.3 |
| S10 | 12.4 | Nitric Acid | 0.3 |
| S11 | 12.3 | Phenol | 0 |
| S12 | 12.7 | Formic Acid | 0 |
| S13 | 12.1 | Sulfuric Acid | 0 |
| S14 | 12.3 | Phosphoric Acid | 0 |
| S15 | 12.6 | Oxalic Acid | 0 |
| S16 | 12.5 | Catechol | 0 |
| M1 | 12.1 | Hydroxylamine | 67 |

Referring to Table 28, the data shows that at the low process temperature of 45° C., all of the above tested potential titanium residue removal enhancers (with the exception of hydroxylamine) were ineffective. The lack of effectiveness for hydrazine shown here confirms the FE-SEM results shown in Example 28. The results shown demonstrate the uniqueness of hydroxylamine for enhancing the relative titanium etch (removal) rates.

EXAMPLE 30

Aqueous solution "R1" was prepared by combining 583 grams de-ionized water, 4.68 grams 25% aqueous tetramethylammonium hydroxide (TMAH) and 8.64 grams tetramethylammonium silicate (TMAS, 10.0% as $SiO_2$) and 0.66 grams trans-(1,2-cyclohexylenedinitrilo)tetraacetic acid (CyDTA) and had a pH of 11.3. Aqueous solution "R2" was prepared by combining 99.0 grams of solution "R1", 0.33 grams of 25% aqueous tetramethylammonium hydroxide (TMAH) and 1.0 grams of 50% aqueous hydroxylamine (solution pH=12.0). Aqueous solution "R3" was prepared by combining 99.0 grams of solution "R1", 0.34 grams of 25% aqueous tetramethylammonium hydroxide (TMAH) and 5.0 grams of 50% aqueous hydroxylamine (solution pH=1 1.9). Aqueous solution "R4" was prepared by combining 99.0 grams of solution "R1", 0.34 grams of 25% aqueous tetramethylammonium hydroxide (TMAH) and 10.0 grams of 50% aqueous hydroxylamine (solution pH=11.6). Aqueous solution "R5" was prepared by combining 99.0 grams of solution "R1", 0.52 grams of 25% aqueous tetramethylammonium hydroxide (TMAH) and 1.0 grams of 50% aqueous hydroxylamine (solution pH=12.2). Aqueous solution "R6" was prepared by combining 99.0 grams of solution "R1", 0.54 grams of 25% aqueous tetramethylammonium hydroxide (TMAH) and 5.0 grams of 50% aqueous hydroxylamine (solution pH=12.0). Aqueous solution "R7" was prepared by combining 99.0 grams of solution "R1", 0.56 grams of 25% aqueous tetramethylammonium hydroxide (TMAH) and 10.2 grams of 50% aqueous hydroxylamine (solution pH=11.8). Aqueous stock solution "R8" was prepared by combining 583 grams de-ionized water, 4.68 grams 25% aqueous tetramethylammonium hydroxide (TMAH) and 8.64 grams tetramethylammonium silicate (TMAS, 10.0% as $SiO_2$) and had a pH of 12.0. Aqueous solution "R9" was prepared by combining 94.0 grams of solution "R8" and 20.0 grams of 50% aqueous hydroxylamine (solution pH=11.3). Each solution was placed into a 125 ml polyethylene bottle, tightly capped and placed into a oven set at 45° C. for 1 hour of pre-heating. A 0.025 mm×13 mm×50 mm, 99.94% pure titanium foil coupon was washed with de-ionized water, acetone, dried, then weighed on an analytical balance. After one hour of pre-heating each solution was removed from the oven and the titanium foil coupon was then placed into the bottle, tightly re-capped and placed back into the oven. After 24 hours at about 45° C., the bottle was removed from the oven. The titanium foil coupon was removed, rinsed with de-ionized water, followed by an acetone rinse, dried and then weighed on an analytical balance. The relative corrosion rates were determined by weight loss. The results are shown in Table 29.

TABLE 29

Titanium Foil Etch Rate Comparisons

| Solution | pH | Amount Titanium Residue Removal Enhancer Hydroxylamine in Formulation (Weight %) | Relative Titanium Corrosion Rate |
|---|---|---|---|
| R2 | 12.0 | 0.50 | 1 |
| R5 | 12.2 | 0.51 | 1.7 |
| R3 | 11.9 | 2.4 | 5.6 |
| R6 | 12.0 | 2.4 | 5.8 |
| R4 | 11.6 | 4.6 | 20 |
| R7 | 11.8 | 4.7 | 23 |
| R9 | 11.3 | 8.9 | 31 |

Referring to Table 29, the data shows that as the concentration of the titanium residue removal enhancer hydroxylamine is increased, the relative titanium foil removal rate also increases. The titanium removal rate in this test is proportional to effectiveness in cleaning wafer sample #11.

EXAMPLE 31

Aqueous solution "M1" was prepared with 1.2 weight percent tetramethylammonium hydroxide (TMAH), 0.45 weight percent trans-(1,2-cyclohexylenedinitrilo)-tetraacetic acid (CyDTA), 0.14 weight percent (calculated as % $SiO_2$) tetramethylammonium silicate (TMAS), 18.5 weight percent hydroxylamine and 0.07 weight percent of the non-ionic surfactant Surfynol-465 (remainder of this solution being water) and has a pH of about 12.1. Aqueous solution "P1" was prepared with 2.2 weight percent tetramethylammonium hydroxide (TMAH), 0.11 weight percent trans-(1,2-cyclohexylenedinitrilo)-tetraacetic acid (CyDTA), 0.14 weight percent (calculated as % $SiO_2$) tetramethylammonium silicate (TMAS) and 1.6 weight percent hydrogen peroxide (remainder of this solution being water) and has a pH of about 11.5. Commercially available post etch residue removers used for comparisons were EKC-265™ (a product of EKC Technology, Inc.) and ACT-935TM (a product of ACT, Inc.). Wafer sample #11 with 0.3–0.5 micron wide by 0.5 micron deep holes (vias) through dielectric and titanium nitride layers exposing Aluminum-Copper metal at the base had been previously processed as follows (a) metallization with aluminum-copper followed by titanium nitride (b) coated with silicon oxide dielectric using chemical vapor deposition (c) lithographic patterning of vias using a photoresist material (d) pattern transfer to the dielectric layer using a reactive ion etching (e) oxygen plasma ashing to remove most of the residual photoresist, but leaving mainly inorganic titanium containing residues behind (determined by Auger Electron Spectroscopic analysis of cross-sectioned via residues). These samples were used to evaluate the performance of the solutions. A wafer sample was placed in the solution at 35° C. for 20 minutes. removed, rinsed with de-ionized water and dried with pressurized nitrogen gas. After drying. the sample vias were cross-sectioned and then inspected on a Field Emission Scanning Electron Microscope (FE-SEM) to determine the extent of cleaning and/or corrosion of the features. The results are shown in Table 30.

TABLE 30

FE-SEM Evaluation Results Comparison

| Solution | pH | Time (min.) | Temp. (° C.) | Titanium Residue Removal Enhancer Added | Post-Ash Residue Removed (%) | Aluminum Metal Corrosion (% Metal Loss) |
|---|---|---|---|---|---|---|
| P1 | 11.5 | 20 | 35 | Hydrogen Peroxide | 100 | 1 (very slight) |
| M1 | 12.1 | 20 | 35 | Hydroxylamine | 100 | 3 (slight) |
| EKC-265 ™ | 11.5–12.0 (from MSDS) | 20 | 35 | Contains Hydroxylamine | 0 | 0 |
| ACT-935 ™ | 11.0 (from MSDS) | 20 | 35 | Contains Hydroxylamine | 0 | 0 |

Referring to Table 30, the data shows that at the low process temperature of 35° C., the compositions of this invention were effective in removing residues known to contain titanium. This data also shows that the use of the titanium residue removal enhancer hydroxylamine for low temperature cleaning is unique to the compositions of this invention.

EXAMPLE 32

Aqueous solution "L" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465, 0.14 weight percent (calculated as % $SiO_2$) tetramethylammonium silicate (TMAS) and 3 weight percent glycerol added with the remainder of this solution being water and has a pH of about 12.1. Aqueous solution "M1" was prepared with 1.2 weight percent tetramethylammonium hydroxide (TMAH), 0.45 weight percent trans-(1,2-cyclohexylenedinitrilo)-tetraacetic acid (CyDTA), 0.14 weight percent (calculated as % $SiO_2$) tetramethylammonium silicate (TMAS), 18.5 weight percent hydroxylamine and 0.07 weight percent of the non-ionic surfactant Surfynol-465 (remainder of this solution being water) and has a pH of about 12.1. Aqueous solution "P1" was prepared with 2.2 weight percent tetramethylammonium hydroxide (TMAH), 0.11 weight percent trans-(1,2-cyclohexylenedinitrilo)-tetraacetic acid (CyDTA), 0.14 weight percent (calculated as % $SiO_2$) tetramethylammonium silicate (TMAS) and 1.6 weight percent hydrogen peroxide (remainder of this solution being water) and has a pH of about 11.5. A silicon wafer sample with a cured layer of hydrogen silsesquioxane (HSQ) low-k dielectric was placed in a Fourier Transform Infra-Red (FTIR) Spectrometer and a reference spectra was taken. HSQ has Si-H bonds in its structure and is apparent at 2100 $cm^{-1}$. The wafer sample was then treated in one of the above solutions for 10 minutes at room temperature (about 22° C.), rinsed with de-ionized water, then dried. The sample was then placed into the FTIR and a second spectrum obtained. The S-H peak area at about 2100 $cm^{-1}$ was used for comparing the treated wafer spectrum to the reference spectrum. A commercially available post etch residue remover, EKC-265™ (a product of EKC Technology, Inc.) was also tested in the same manner, at the manufacturer's recommended temperature of 65° C. (10 minutes), for comparison. The results are shown in Table 31.

TABLE 31

HSQ Low-k Dielectric Compatibility Test Results

| Solution | pH | Time (min.) | Temp. (° C.) | Titanium Residue Removal Enhancer Added | Percent Si-H Infra-Red Peak Remaining in HSQ |
|---|---|---|---|---|---|
| L | 12.1 | 10 | 22 | NONE | 95 |
| P1 | 11.5 | 10 | 22 | Hydrogen Peroxide | 99.5 |
| M1 | 12.1 | 10 | 22 | Hydroxylamine | 85 |
| EKC-265 ™ | 11.5–12.0 (from MSDS) | 10 | 65 | Contains Hydroxylamine | 0 |

Referring to Table 31, the data shows that the compositions of this invention are unique in that they are compatible with sensitive low-k dielectric substrates such as HSQ.

EXAMPLE 33

Aqueous solution "A" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465 (a product of Air Products and Chemicals, Inc.) and 0.14 weight percent (calculated as % $SiO_2$) tetramethylammonium silicate (TMAS) added (remainder of this solution being water) and has a pH of about 12.2. Aqueous solution "L" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465. 0.14 weight percent (calculated as % $SiO_2$) tetramethylammonium silicate (TMAS) and 3 weight percent glycerol added with the remainder of this solution being water and has a pH of about 12.1. Aqueous solution "M1" was prepared with 1.2 weight percent tetramethylammonium hydroxide (TMAH), 0.45 weight percent trans-(1,2-cyclohexylenedinitrilo)-tetraacetic acid (CyDTA), 0.14 weight percent (calculated as % $SiO_2$) tetramethylammonium silicate (TMAS), 18.5 weight percent hydroxylamine and 0.07 weight percent of the non-ionic surfactant Surfynol-465 (remainder of this solution being water) and has a pH of about 12.1. Aqueous solution "P1" was prepared with 2.2 weight percent tetramethylammonium hydroxide (TMAH), 0.11 weight percent trans-(1,2-cyclohexylenedinitrilo)-tetraacetic acid (CyDTA), 0.14 weight percent (calculated as % $SiO_2$) tetramethylammonium silicate (TMAS) and 1.6 weight percent hydrogen peroxide (remainder of this solution being water) and has a pH of about 11.5. Aqueous stock solution "T1" was prepared with 1.6 weight percent tetramethylammonium hydroxide (TMAH), 0.41 weight percent trans-(1,2-cyclohexylenedinitrilo)tetraacetic acid (CyDTA), 0.27 weight percent of the non-ionic surfactant Surfynol-465, 0.56 weight percent (calculated as % $SiO_2$) tetramethylammonium silicate (TMAS) and 12 weight percent glycerol added with the remainder of this solution being water and has a pH of about 12.5. Aqueous solution "T2" was prepared by diluting 25 ml solution "T1" with 70 ml de-ionized water and 5 ml of glycerol. Aqueous solution "T3" was prepared by diluting 25 ml solution "T1" with 65 ml de-ionized water and 10 ml of glycerol. Aqueous solution "T4" was prepared by diluting 25 ml solution "T1" with 60 ml de-ionized water and 15 ml of glycerol. Aqueous solution "T5" was prepared by diluting 25 ml solution "T1" with 55 ml de-ionized water and 20 ml of glycerol. Aqueous solution "T6" was prepared by diluting 25 ml solution "T1" with 50 ml de-ionized water and 25 ml of glycerol. Aqueous solution "T7" was prepared by diluting 25 ml solution "T1" with 25 ml de-ionized water and 50 ml of glycerol. Aqueous solution "T8" was prepared by diluting 25 ml solution "T1" with 75 ml of glycerol. Aqueous solution "T9" was prepared by diluting 25 ml solution "T1" with 70 ml de-ionized water and 5 ml of 1-(2-hydroxyethyl)-2-pyrrolidinone (HEP). Aqueous solution "T10" was prepared by diluting 25 ml solution "T1" with 65 ml de-ionized water and 10 ml of 1-(2-hydroxyethyl)-2-pyrrolidinone (HEP). Aqueous solution "T11" was prepared by diluting 25 ml solution "T1" with 60 ml de-ionized water and 15 ml of 1-(2-hydroxyethyl)-2-pyrrolidinone (HEP). Aqueous solution "T12" was prepared by diluting 25 ml solution "T1" with 55 ml de-ionized water and 20 ml of 1-(2-hydroxyethyl)-2-pyrrolidinone (HEP). Aqueous solution "T13" was prepared by diluting 25 ml solution "T1" with 50 ml de-ionized water and 25 ml of 1-(2-hydroxyethyl)-2-pyrrolidinone (HEP). Aqueous solution "T14" was prepared by diluting 25 ml solution "T1" with 25 ml de-ionized water and 50 ml of 1-(2-hydroxyethyl)-2-pyrrolidinone (HEP). Aqueous solution "T15" was prepared by diluting 25 ml solution "T1" with 75 ml of 1-(2-hydroxyethyl)-2-pyrrolidinone (HEP). Each solution was placed into a 125 ml polyethylene bottle, tightly capped and either placed into a oven set at 45° C., 65° C. or 85° C. for 1 hour of pre-heating or kept at room temperature (about 22° C.). A 0.025 mm×13 mm×50 mm, pure copper foil coupon was dipped in dilute hydrochloric acid, washed with de-ionized water, acetone, dried, then weighed on an analytical balance. After one hour of pre-heating each solution was removed from the oven (if heated) and the copper foil coupon was then placed into the bottle, tightly re-capped and placed back into the oven. After 24 hours at about 22–85° C., the bottle was removed from the oven. The copper foil coupon was removed, rinsed with de-ionized water, followed by an acetone rinse, dried and then weighed on an analytical balance. The corrosion rates were determined by weight loss. Commercially available post etch residue removers EKC-265™ (a product of EKC Technology, Inc.), EKC-270™ (a product of EKC Technology, Inc.), EKC-311™ (a product of EKC Technology, Inc.), ACT-935TM (a product of ACT, Inc.), ACT NP-937™ (a product of ACT, Inc.) and ACT-941™ (a product of ACT, Inc.) was also tested in the same manner, at the manufacturer's recommended temperature of 65° C., for comparison. The results are shown in Table 32.

TABLE 32

Copper Foil Etch Rate Comparisons

| Solution | Titanium Residue Removal Enhancer Added | Organic Co-Solvent(s) Added to Reduce Copper Corrosion (Volume %) | Temperature (° C.) | Copper Foil Corrosion Rate (Angstroms/hour) |
|---|---|---|---|---|
| P1 | Hydrogen Peroxide | NONE | RT | 0 |
|  |  |  | 45 | 29 |
| A | NONE | NONE | 45 | 170 |
| L | NONE | Glycerol (2.4%) | RT | 38 |
|  |  |  | 45 | 190 |
|  |  |  | 85 | 135 |
| T2 | NONE | Glycerol (7.4%) | 85 | 79 |
| T3 | NONE | Glycerol (12.4%) | 85 | 46 |
| T4 | NONE | Glycerol (17.4%) | 85 | 30 |
| T5 | NONE | Glycerol (22.4%) | 85 | 7 |
| T6 | NONE | Glycerol (27.4%) | 85 | 0 |
| T7 | NONE | Glycerol (52.4%) | 85 | 0 |
| T8 | NONE | Glycerol (77.4%) | 85 | 8 |
| T9 | NONE | Glycerol (2.4%) HEP (5.0%) | 85 | 26 |
| T10 | NONE | Glycerol (2.4%) HEP (10%) | 85 | 24 |
| T11 | NONE | Glycerol (2.4%) HEP (15%) | 85 | 19 |
| T12 | NONE | Glycerol (2.4%) HEP (20%) | 85 | 0 |
| T13 | NONE | Glycerol (2.4%) HEP (25%) | 85 | 7 |
| T14 | NONE | Glycerol (2.4%) HEP (50%) | 85 | 11 |
| T15 | NONE | Glycerol (2.4%) HEP (75%) | 85 | 11 |
| ACT-935 ™ | Contains Hydroxylamine | Unknown | 65 | >125,000 |
| ACT NP-937 ™ | Contains Hydroxylamine | Unknown | 65 | 66,900 |
| ACT-941 ™ | Contains Hydroxylamine | Unknown | 65 | >125,000 |
| EKC-265 ™ | Contains Hydroxylamine | Unknown | 65 | >125,000 |
| EKC-270 ™ | Contains Hydroxylamine | Unknown | 65 | >62,000 |
| EKC-311 ™ | Contains Hydroxylamine | Unknown | 65 | >62,000 |
| M1 | Hydroxylamine | NONE | 45 | 3,600* |

*16 hour test at 45° C.

Referring to Table 32, the data shows that several of the compositions of this invention are compatible with copper. The data also shows that M1, a composition of this invention is superior to commercially available hydroxylamine-containing post etch residue remover formulations for use with copper metallizations. Additionally, the data shows that the addition of the titanium residue removal enhancer hydrogen peroxide reduces the copper corrosion rate.

EXAMPLE 34

Aqueous solution "L" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465, 0.14 weight percent (calculated as % $SiO_2$) tetramethylammonium silicate (TMAS) and 3 weight percent glycerol added with the remainder of this solution being water and has a pH of about 12.1. In a clean-room, a wafer particle counter was used to count the total particles (0.1–10 microns is size) found on a 3 inch silicon wafer with 650 angstroms of thermal oxide. The wafer was then chemically mechanically polished (CMP) with an alumina-based polishing slurry then rinsed with de-ionized water. Solution "L" was then used at room temperature (about 22° C.) to "brush-clean" the wafer, followed by rinsing with de-ionized water and spin drying. The wafer particle counter was then used to count the total particles present (0.1–10 microns in size) on the wafer's surface after cleaning. For comparison, a second wafer was tested with de-ionized water used as the post-CMP "brush-cleaner". The results are shown in Table 33.

TABLE 33

Post-CMP Cleaning Test Results

| Solution | pH | Time (min.) | Temp. (° C.) | Total Particle Counts Before CMP | Total Particle Counts After Post-CMP Cleaning |
|---|---|---|---|---|---|
| DI-Water | 7 | 10 | 22 | 672 | 29,484 |
| L | 12.1 | 10 | 22 | 782 | 103 |

Referring to Table 33, the data shows that the compositions of this invention are unique because they remove particulate contamination occurring after chemical mechanical polishing.

EXAMPLE 35

Aqueous solution "L" was prepared with 0.3 weight percent tetramethylammonium hydroxide (TMAH), 0.1 weight percent trans-(1,2-cyclohexylenedinitrilo)tetraacetic acid (CyDTA), 0.07 weight percent of the non-ionic surfactant Surfynol-465, 0.14 weight percent (calculated as % $SiO_2$) tetramethylammonium silicate (TMAS) and 3 weight percent glycerol added with the remainder of this solution being water and has a pH of about 12.1. Aqueous solution "M1" was prepared with 1.2 weight percent tetramethylammonium hydroxide (TMAH), 0.45 weight percent trans-(1,2-cyclohexylenedinitrilo)-tetraacetic acid (CyDTA), 0.14 weight percent (calculated as % $SiO_2$) tetramethylammonium silicate (TMAS), 18.5 weight percent hydroxylamine and 0.07 weight percent of the non-ionic surfactant Surfynol-465 (remainder of this solution being water) and has a pH of about 12.1. Aqueous solution "P1" was prepared with 2.2 weight percent tetramethylammonium hydroxide (TMAH), 0.11 weight percent trans-(1,2-cyclohexylenedinitrilo)-tetraacetic acid (CyDTA), 0.14 weight percent (calculated as % $SiO_2$) tetramethylammonium silicate (TMAS) and 1.6 weight percent hydrogen peroxide (remainder of this solution being water) and has a pH of about 11.5. Sections from the same Si(100) wafer with approximately 650 nm of thermal oxide were washed with acetone, dried, then measured with a Rudolph FTM Interferometer to determine the thermal oxide thickness. Four areas were measured and mapped for a follow-up measurement after treatment. Each sample was then placed into the bottle, loosely re-capped and placed into the oven, which was pre-set to 45° C. or left at room temperature (about 22° C.). After 24 hours at about 22° C. or about 45° C., the bottle was removed from the oven, sample removed, rinsed with water, followed by an acetone rinse, dried and then measured on the Interferometer. The relative etch rates were determined by the difference in thermal oxide film thickness averaged for four areas on the sample. Commercially available post etch residue removers EKC-265™ (a product of EKC Technology, Inc.), EKC-270™ (a product of EKC Technology, Inc.), EKC-311™ (a product of EKC Technology, Inc.), ACT-935™ (a product of ACT, Inc.), ACT NP-937™ (a product of ACT, Inc.) and ACT-941™ (a product of ACT, Inc.) was also tested in the same manner, at the manufacturer's recommended temperature of 65° C., for comparison. The results are shown in Table 34.

TABLE 34

Thermal Oxide on Silicon Etch Rate Comparisons

| Solution | pH | Temp. (° C.) | Titanium Residue Removal Enhancer Added | Thermal Oxide Etch Rate (Angstroms/hour) |
|---|---|---|---|---|
| L | 12.1 | 45 | NONE | 4.2 |
| P1 | 11.5 | 22 | Hydrogen Peroxide | 1.2 |
| M1 | 12.1 | 45 | Hydroxylamine | 0 |
| ACT-935 ™ | 11.0 (from MSDS) | 65 | Contains Hydroxylamine | 6* |
| ACT NP-937 ™ | 11.1 (from MSDS) | 65 | Contains Hydroxylamine | 6* |
| ACT-941 ™ | 11.5 (from MSDS) | 65 | Contains Hydroxylamine | 6* |
| EKC-265 ™ | 11.5–12.0 (from MSDS) | 65 | Contains Hydroxylamine | 7.2 |
| EKC-270 ™ | 10.8 | 65 | Contains Hydroxylamine | 13.7 |
| EKC-311 ™ | 10.8–11.4 (from MSDS) | 65 | Contains Hydroxylamine | 12.6 |

*18 hour test at 65° C.

Referring to Table 34, the data shows that the compositions of this invention are unique in that they clean unwanted residues from wafer substrates without unwanted etching of the dielectric layer. These results agree with the results presented in Example #15 for silicate containing compositions. The examples illustrate ten surprising and unexpected results associated with this invention. First, the ability to clean unwanted residues from wafer surfaces at low operating temperatures and times while preventing unwanted metal corrosion. Second, the unexpectedly high bath stability of very dilute, high pH compositions using silicate (pKa=11.8) as a buffer. Third, silicates added to the highly alkaline cleaners inhibit the unwanted dissolution of silicon dioxide dielectric materials present in integrated circuits. Fourth, since the compositions are highly aqueous (typically >80% water), no intermediate rinse is needed before the water rinse to prevent post-cleaning corrosion. Fifth, because of the high water content of these compositions, the health, safety and environmental risks associated with use and handling are significantly reduced over typical organic photoresist strippers and post plasma ash residue removers. Sixth, the compositions of this invention have been shown to leave substantially less carbon residual contamination on the substrate surface after treatment when compared to a typical organic post-ash residue remover. Seventh, the compositions of this invention have been found to be compatible with the sensitive low-k dielectric materials used in integrated circuits. Eighth, the ability to remove difficult titanium containing residues at low temperatures. Ninth, the compositions of this invention have been found to be compatible with copper metal. Tenth, the compositions of this invention have also been found to be effective in removing silica and alumina chemical mechanical polishing (CMP) slurry residues from wafer substrates. While silicates are known aluminum corrosion inhibitors, the ability to inhibit aluminum corrosion, yet selectively remove metal-containing photoresist residues, that typically have a high aluminum and/or titanium content, was surprising and unexpected. The buffering action of silicate, the negligible carbon contamination of the substrate surface during treatment, the low dielectric etching rate. compatibility with sensitive low-k dielectric materials, compatibility with copper metal, ability to remove difficult titanium containing residues at low temperatures, ability to clean silica and alumina chemical mechanical polishing (CMP) slurry residues and the ability to effectively employ such high water concentrations were also surprising and unexpected aspects of this invention.

Obviously many modifications and variations of the present invention are possible in light of the above teachings. It is therefore to be understood that within the scope of the appended claims the invention may be practiced otherwise than as specifically described.

I claim:

1. A composition for stripping or cleaning integrated circuit substrates, comprising:
    (a) one or more metal ion-free bases;
    (b) a water-soluble metal ion-free silicate;
    (c) one or more chelating agents; and
    (d) water,
wherein the chelating agent is selected from the group consisting of (ethylenedinitrilo)tetraacetic acid, diethylenetriaminepentaacetic acid, triethylenetetraminehexaacetic acid, 1,3-diamino-2-hydroxypropane-N,N,N',N'-tetraacetic acid, N,N,N',N'-ethylenediaminetetra(methylenephosphonic acid), and (1,2-cyclohexyllenedinitrilo)-tetraacetic acid.

2. The composition of claim 1 wherein the metal ion-free bases are present in sufficient amounts to produce a pH of from about 11 to about 13.

3. The composition of claim 1 wherein the concentration of water-soluble metal ion-free silicate is from about 0.01% to about 5% by weight (as $SiO_2$) of the composition.

4. The composition of claim 1, wherein the concentration of chelating agents is from about 0.01% to about 10% by weight of the composition.

5. The composition of claim 1 further containing one or more water-soluble organic co-solvents.

6. The composition of claim 5 wherein the concentration of water-soluble organic co-solvents is from about 0.1% to about 80% by weight of the composition.

7. The composition of claim 5 wherein said water-soluble organic co-solvent is selected from the group consisting of 1-hydroxyalkyl-2-pyrrolidinones, alcohols and polyhydroxy compounds.

8. The composition of claim 1 further containing one or more titanium residue removal enhancing agents.

9. The composition of claim 8 wherein the concentration of titanium residue removal enhancing agents is from about 1% to about 50% by weight of the composition.

10. The composition of claim 1 wherein the titanium residue removal enhancing agent is selected from the group consisting of hydroxylamine, hydroxylamine salts, peroxides, ozone and fluoride.

11. The composition of claim 1 further containing one or more water-soluble surfactants.

12. The composition of claim 11 wherein the concentration of water-soluble surfactants is from about 0.01% to about 1% by weight of the composition.

13. The composition of claim 1 wherein the base is selected from the group consisting of hydroxides and organic amines.

14. The composition of claim 13 wherein the base is selected from the group consisting of quaternary ammonium hydroxides, ammonium hydroxides, and organic amines.

15. The composition of claim 1 wherein the base is selected from the group consisting of choline, tetrabutylammonium hydroxide, tetramethylammonium hydroxide, methyltriethanolammonium hydroxide, and methyltriethylammonium hydroxide.

16. The composition of claim 1 wherein the water-soluble metal ion-free silicate is selected from the group consisting of ammonium silicates and quaternary ammonium silicates.

17. The composition of claim 1 wherein the water-soluble metal ion-free silicate is tetramethylammonium silicate.

18. The composition of claim 1 containing from about 0.1–3% by weight of the composition of tetramethylammonium hydroxide and about 0.01–1% by weight of the composition of tetramethylammonium silicate.

19. The composition of claim 18 further containing from about 0.01–1% by weight of the composition of trans-(1,2-cyclohexylenedinitrilo)tetraacetic acid.

20. The chemical composition formed by mixing
    (a) one or more metal ion-free bases;
    (b) a water-soluble metal ion-free silicate;
    (c) one or more chelating agents; and
    (d) water,
wherein the chelating agent is selected from the group consisting of (ethylenedinitrilo)tetraacetic acid, diethylenetriaminepentaacetic acid, triethylenetetraminehexaacetic acid, 1,3-diamino-2-hydroxypropane-N,N,N',N'-tetraacetic acid, N,N,N',N'-ethylenediaminetetra(methylenephosphonic acid), and (1,2-cyclohexyllenedinitrilo)-tetraacetic acid.

21. A composition for stripping or cleaning integrated circuit substrates, comprising:
    (a) one or more metal ion-free bases;
    (b) a water-soluble metal ion-free silicate;
    (c) one or more titanium residue removal enhancing agents; and
    (d) water.

22. The composition of claim 21 wherein the concentration of titanium residue removal enhancing agent is from about 1% to about 50% by weight of the composition.

23. The composition of claim 22 wherein the titanium residue removal enhancing agent is selected from the group consisting of hydroxylamine, hydroxylamine salts, peroxides, ozone and fluoride.

24. The composition of claim 23 wherein the one or more metal-ion free bases are present in an amount sufficient to produce a pH of the composition of from about 11 to about 13.1

25. The composition of claim 23 wherein the concentration of water-soluble metal ion-free silicate is from about 0.01% to about 5% by weight (as $SiO_2$) of the composition.

26. The composition of claim 23 further containing one or more chelating agents.

27. The composition of claim 26 wherein the concentration of chelating agents is from about 0.01% to about 10% by weight of the composition.

28. The composition of claim 27 wherein the chelating agent is an aminocarboxylic acid.

29. The composition of claim 27 wherein the chelating agent is selected from the group consisting of (ethylenedinitrilo)tetraacetic acid, diethylenetriaminepentaacetic acid, triethylenetetraminehexaacetic acid, 1,3-diamino-2-hydroxypropane-N,N,N',N'-tetraacetic acid, N,N,N',N'-ethylenediaminetetra-(methylenephosphonic acid), and (1,2-cyclohexyllenedinitrilo)-tetraacetic acid.

30. The composition of claim 23 further containing one or more water-soluble organic co-solvents.

31. The composition of claim 30 wherein the concentration of water-soluble organic co-solvents is from about 0.1% to about 80% by weight of the composition.

32. The composition of claim 30 wherein said water-soluble organic co-solvent is selected from the group consisting of 1-hydroxyalkyl-2-pyrrolidinones, alcohols and polyhydroxy compounds.

33. The composition of claim 23 further containing one or more water-soluble surfactants.

34. The composition of claim 33 wherein the water-soluble surfactant is a nonionic ethoxylated acetylenic diol surfactant.

35. The composition of claim 23 wherein the metal ion-free base is selected from the group consisting of hydroxides and organic amines.

36. The composition of claim 35 wherein the metal ion-free base is selected from the group consisting of quaternary ammonium hydroxides, ammonium hydroxides and organic amines.

37. The composition of claim 23 wherein the metal ion-free base is selected from the group consisting of choline, tetrabutylammonium hydroxide, tetramethyammmonium hydroxide, methyltriethanolammonium hydroxide, and methyltriethylammonium hydroxide.

38. The composition of claim 23 wherein the water-soluble metal ion-free silicate is selected from the group consisting of ammonium silicates and quaternary ammonium silicates.

39. The composition of claim 23 wherein the water-soluble matal ion-free silicate is tetramethylammonium silicate.

40. The composition of claim 23 containing from about 0.1% to about 3% by weight tetramethylammonium hydroxide and from about 0.01% to about 1% by weight tetramethylammonium silicate based on the weight of the composition.

41. The composition of claim 40 further containing from about 0.01% to about 1% by weight of the Composition of trans(1,2-cyclohexylenedinitrilo)tetraacetic acid.

42. The composition of claim 34 wherein the titanium residue removal enhancing agent is hydroxylamine in an amount of from about 1% to about 30% by weight and the nonionic ethoxylated acetylenic diol surfactant is present in an amount of from about 0.01% to about 1% by weight of the composition.

43. The composition of claim 42 wherein the metal ion-free base is tetramethylammonium hydroxide, the water-soluble metal ion-free silicate is tetramethylammonium silicate.

44. The composition of claim 40 wherein the titanium residue removal enhancing agent is hydroxylamine in an amount of from about 1% to about 30% by weight of the composition and the composition further contains a nonionic ethoxylated acetylenic diot surfactant in an amount of from about 0.01% to about 1% by weight of the composition.

45. The composition of claim 6 wherein the water-soluble organic co-solvent is glycerol.

46. The composition of claim 45 wherein the composition further comprises from a nonionic ethoxylated acetylenic diol surfactant in an amount of from about 0.01% to about 1% by weight of the composition.

47. The composition of claim 19 wherein the composition further contains glycerol as a water-soluble organic co-solvent in an amount of from about 0.1% to about 80% by weight of the composition.

48. The composition of claim 47 wherein the composition further comprises from a nonionic ethoxylated acetylenic diol surfactant in an amount of from about 0.01% to about 1% by weight of the composition.

* * * * *

UNITED STATES PATENT AND TRADEMARK OFFICE
CERTIFICATE OF CORRECTION

PATENT NO. : 6,465,403 B1
DATED : October 15, 2002
INVENTOR(S) : David C. Skee

It is certified that error appears in the above-identified patent and that said Letters Patent is hereby corrected as shown below:

<u>Title page,</u>
Item [57], ABSTRACT, should read -- %$SiO_2$ -- instead of "%SiO.sub.2"

<u>Column 57, line 29, Column 58, line 28 and 62,</u>
Should read -- (1,2-cyclohexylenedinitrilo) -- instead of "(1,2-cyclohexyllenedinitrilo)"

<u>Column 58,</u>
Lines 44-45, should read -- about 11 to 13 -- instead of "about 11 to 13.1"

<u>Column 59,</u>
Line 21, should read -- tetramethylammonium hydroxide -- instead of "tetramethyammonium"hydroxide"

Signed and Sealed this

Twenty-second Day of April, 2003

JAMES E. ROGAN
*Director of the United States Patent and Trademark Office*